(12) United States Patent
Nitta et al.

(10) Patent No.: US 7,488,989 B2
(45) Date of Patent: Feb. 10, 2009

(54) SEMICONDUCTOR LIGHT EMITTING ELEMENT, ITS MANUFACTURING METHOD AND SEMICONDUCTOR LIGHT EMITTING DEVICE

(75) Inventors: Koichi Nitta, Kanagawa (JP); Takafumi Nakamura, Fukuoka (JP); Akihiro Fujiwara, Fukuoka (JP); Kuniaki Konno, Kanagawa (JP); Yasuharu Sugawara, Kanagawa (JP)

(73) Assignee: KabushikI Kaisha Toshiba, Tokyo (JP)

( * ) Notice: Subject to any disclaimer, the term of this patent is extended or adjusted under 35 U.S.C. 154(b) by 135 days.

(21) Appl. No.: 10/863,269

(22) Filed: Jun. 9, 2004

(65) Prior Publication Data
US 2005/0017250 A1 Jan. 27, 2005

(30) Foreign Application Priority Data
Jun. 10, 2003 (JP) ............................. 2003-164652

(51) Int. Cl.
*H01L 33/00* (2006.01)
(52) U.S. Cl. ................. 257/95; 257/102; 257/E33.003; 257/E33.058; 257/E33.074
(58) Field of Classification Search ...............................
257/E33.056–E33.059, E33.067, E33.068,
257/95, 97, 102, E33.003, E33.074
See application file for complete search history.

(56) References Cited

U.S. PATENT DOCUMENTS

| 5,639,674 | A * | 6/1997 | Nozaki et al. ................. 117/89 |
| 5,753,940 | A * | 5/1998 | Komoto ........................ 257/95 |
| 5,779,924 | A * | 7/1998 | Krames et al. ................. 216/24 |
| 5,990,497 | A * | 11/1999 | Kamakura et al. ............ 257/94 |
| 6,395,572 | B1 * | 5/2002 | Tsutsui et al. ................. 438/46 |
| 6,433,364 | B2 * | 8/2002 | Hosoba et al. ................. 257/80 |
| 6,465,809 | B1 | 10/2002 | Furukawa et al. |
| 6,586,773 | B2 | 7/2003 | Saeki et al. |
| 6,643,364 | B1 | 11/2003 | Takahashi |
| 6,700,139 | B2 | 3/2004 | Suzuki et al. |
| 6,730,939 | B2 * | 5/2004 | Eisert et al. .................... 257/98 |
| 6,791,119 | B2 * | 9/2004 | Slater et al. .................... 257/99 |
| 6,815,312 | B2 | 11/2004 | Furukawa et al. |
| 6,846,686 | B2 | 1/2005 | Saeki et al. |
| 2003/0197191 | A1 | 10/2003 | Nitta et al. |
| 2004/0026700 | A1 * | 2/2004 | Akaike et al. ................. 257/79 |
| 2004/0070004 | A1 * | 4/2004 | Eliashevich et al. ......... 257/200 |
| 2004/0119078 | A1 | 6/2004 | Konno et al. |

(Continued)

FOREIGN PATENT DOCUMENTS

JP          6-97498          4/1994

(Continued)

OTHER PUBLICATIONS

Patent Abstracts of Japan, JP 2003-338637, Nov. 28, 2003.

*Primary Examiner*—Howard Weiss
*Assistant Examiner*—John C Ingham
(74) *Attorney, Agent, or Firm*—Oblon, Spivak, McClelland, Maier & Neustadt, P.C.

(57) ABSTRACT

A light emitting element comprises a GaP substrate and a mesa portion. The GaP substrate includes a major surface inclined to the <011> direction from the {100} plane and a side surface covered with inequalities substantially. The mesa portion has a light emitting multi-layer of InGaAlP based material provided on the major surface. A part of a light emitted from the light emitting multi-layer is extracted through the side surface of the GaP substrate.

20 Claims, 28 Drawing Sheets

U.S. PATENT DOCUMENTS

2004/0227148 A1 * 11/2004 Camras et al. .............. 257/99

FOREIGN PATENT DOCUMENTS

| | | |
|---|---|---|
| JP | 10-223929 | 8/1998 |
| JP | 10-341035 | 12/1998 |
| JP | 2000-22217 | 1/2000 |
| JP | 2000-299494 | 10/2000 |
| JP | 2001-57441 | 2/2001 |
| JP | 2001-291895 | 10/2001 |
| JP | 2001-352097 | 12/2001 |
| JP | 2002-9334 | 1/2002 |
| JP | 2002-203987 | 7/2002 |
| JP | 2002-237620 | 8/2002 |
| JP | 2003-78162 | 3/2003 |
| JP | 2003-298108 | 10/2003 |
| WO | WO 01/61764 A1 | 8/2001 |

* cited by examiner

SEMICONDUCTOR LIGHT EMITTING ELEMENT, ITS MANUFACTURING METHOD AND SEMICONDUCTOR LIGHT EMITTING DEVICE

CROSS-REFERENCE TO RELATED APPLICATION

This application is based upon and claimed the benefits of priority from the prior Japanese Patent Application No. 2003-164652, filed on Jun. 10, 2003, the entire contents of which are incorporated herein reference.

BACKGROUND OF THE INVENTION

This invention relates to a semiconductor light emitting element, its manufacturing method and a semiconductor light emitting device, especially to a semiconductor light emitting diode in which a light is emitted by injecting a current into a p-n junction and the light can be extracted with a higher efficiency, its manufacturing method and a semiconductor light emitting device using the light emitting diode.

A semiconductor light emitting device has been widely used due to the advantages such as a lower consumption power, a higher efficiency and higher reliability in a various kinds of display devices and LCD back-light instead of an incandescent bulb. Especially, since InGaAlP based material has a direct transition property, the light of which wavelength is between red and green is obtained with a higher efficiency. Therefore demands are expanding for a red stop lamp for a car, a yellow turn signal lamp for a car, and a red and yellow lamp for a traffic signal.

A basic structure of the semiconductor light emitting device is explained below. A light emitting device emits a spontaneous light by the recombination of electron-hole pairs in an active layer when a current is injected into a p-n junction. In general, the light emitting element in a chip form is mounted on a lead frame having a reflecting metal and is encapsulated in an epoxy resin having a lens function. A part of the emitted light propagates through the lens-like package directly, and another part of the emitted light is reflected by the reflecting metal and then propagates outward through the lens-like package. The structure of the chip will be described below.

A GaAs substrate is used for growth of an InGaAlP based multi-layer. However since the GaAs substrate absorbs the light emitted from InGaAlP based material, another method has been introduced by which the InGaAlP based multi-layer is formed on the GaAS substrate, the surface of the multi-layer is bonded to a GaP substrate and the GaAs substrate is removed finally. The GaP does not absorb the light from InGaAlP based material and hence is transparent substantially.

Although the device fabricated by the above-mentioned method can reduce the absorption to some extent, the light extraction efficiency is not high satisfactorily. This is because a part of the light which is emitted toward all directions (360°) is reflected at an interface between the semiconductor and the epoxy resin package due to the refractive index difference, and can not be extracted externally. For example, if the refractive index of the semiconductor is 3.3 and that of the epoxy resin is 1.5, then a critical angle θc becomes 27°(θ=sin$^{-1}$(1.5/3.3)=27°) according to Snell's law.

Therefore, when the light enters into the epoxy resin with an incident angle greater than 27° from the semiconductor, the total reflection occurs and can not be extracted. Since the light emitting device has a hexahedron shape generally, the extraction efficiency may be 28% approximately for ideal case. However the extraction efficiency becomes less than 28%, because an n-side and p-side electrode are provided on both surface, one electrode is mounted on the lead frame or the like with an adhesion bond, and the incident light into the electrode is absorbed in the alloyed layer of the electrode.

In order to solve the above problem, a transparent substrate structure having an appropriately designed shape is disclosed in the Japanese Patent Laid-Open No. 10-341035, for example.

By appropriately forming the shape of the transparent substrate, the light emitted from the active layer is reflected toward the light extraction direction. Consequently, a lot of light can be extracted outside.

The major problems of the above-mentioned device are the poor production yield and the shorter life time of the device. For example, when the device is mounted on a lead frame using a conductive adhesion bond, the assembling yield tends to fall because of the shortage between an edge of the p-n junction and the surface of the n-side electrode. If the amount of the adhesion bond is reduced so as to avoid a contact between the p-n junction and the adhesion bond, the adhesion strength becomes reduced and the device chip tends to fall off from the lead frame during a long operation period. It causes a shorter life time problem.

SUMMARY OF THE INVENTION

According to an aspect of the invention, there is provided a light emitting element comprising: a GaP substrate including: a major surface inclined to the <011> direction from the {100} plane; and a side surface covered with inequalities substantially; a mesa portion having a light emitting multi-layer of InGaAlP based material provided on the major surface, wherein a part of a light emitted from the light emitting multi-layer is extracted through the side surface of the GaP substrate.

According to another aspect of the invention, there is provided a light emitting device comprising: a lead frame; the light emitting element mounted on the lead frame, including a GaP substrate having a major surface inclined to the <011> direction from the {100} plane and a side surface having inequalities of which a mean depth is greater than 1 micrometer, a mesa portion having a light emitting multi-layer of InGaAlP based material provided on the major surface, wherein a part of a light emitted from the light emitting multi-layer is extracted through the side surface of the GaP substrate; and an epoxy resin in which the lead frame and the light emitting element are encapsulated.

According to another aspect of the invention, there is provided a method for manufacturing a light emitting element comprising: forming a light emitting multi-layer based on InGaAlP based materials on a tentative semiconductor substrate; p1 bonding a GaP substrate to a surface of the light emitting multi-layer; removing the tentative semiconductor substrate; forming at least two mesa portions on the major surface of the GaP substrate by removing a part of the light emitting multi-layer selectively; growing a GaP layer so as to cover the mesa portions; forming a protecting film on the mesa potions; dicing the GaP substrate so as to separate each mesa portion; and forming inequalities on an exposed side surface of the GaP substrate after dicing by a liquid or a gas containing fluoric acid.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Referring to drawings, some embodiments of the present invention will now be described in detail.

FIRST EMBODIMENT

Figure 1:
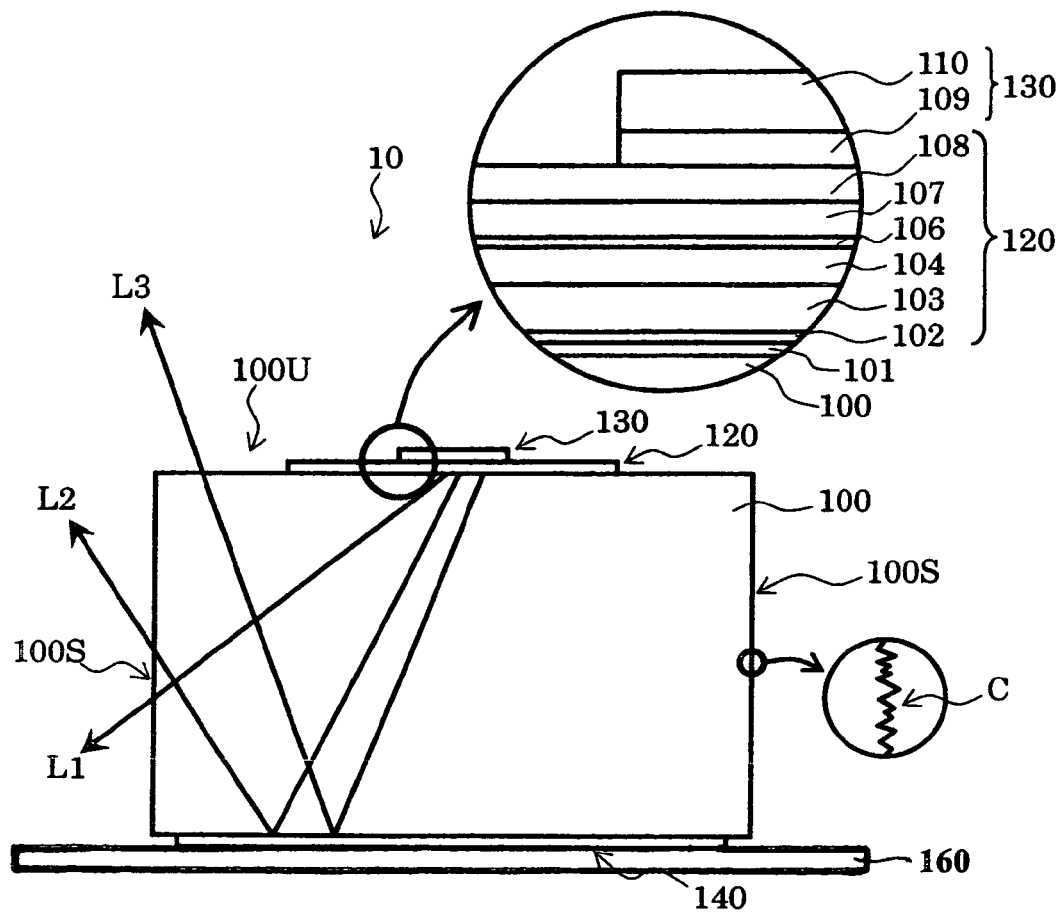
FIG. 1 is a cross-sectional view of the light emitting element according to a first embodiment of the invention.

FIG. 1 is a cross-sectional view of a semiconductor light emitting element according to a first embodiment of the invention. A typical example of the light emitting element is a light emitting diode in a chip form. This light emitting element includes a p-type GaP substrate 100 and a mesa portion 120 of a multi-layer including InGaAlP provided on a major surface of the GaP substrate. "InGaAlP" includes a compound semiconductor which is represented by $In_xGa_yAl_{1-x-y}P$ (where $0 \leq x \leq 1$, $0 \leq y \leq 1$ and $\{x+y\} \leq 1$), hereinafter. On a side surface 100S of the p-type GaP substrate, fine inequalities having a few micrometer depth are formed.

The light extraction efficiency can be improved by preventing a total reflection due to these fine inequalities. This feature is common to the elements of first to fifth embodiments. In the mesa portion 120, there are provided a p-type GaP bonding layer 101, a bonding distortion easing layer 102 of a p-type InGaP, a p-type cladding layer 103 of InGaAlP, an impurity diffusion preventing layer 104 of p-type InGaAlP, a light emitting layer 106 of p-type InGaAlP, an n-type cladding layer 107 of InGaAlP, and an n-type current diffusion layer 108 of InGaAlP. The bonding layer 101 may be provided not only in the mesa portion, but also on the major surface of the GaP substrate 100 entirely. This mesa portion of the multi-layer is grown on a substrate such as GaAS and bonded to the GaP substrate, as described later. On the surface of the mesa portion there are provided an n-type GaAs contact layer 109 and an n-type electrode 110 including Au and Ge at least.

On the other hand, a p-side electrode 140 including Au and Zn at least is provided on an opposite surface of the GaP substrate 100. When a plus voltage is supplied to the p-side electrode, the light is emitted from the light emitting layer 106 and is extracted from the chip. The injected current is restricted by a thermal saturation due to a generated heat and hence determined by a device size (or an area). For example, the allowable operation currents are 20 mA for 150 μm□, 70 mA for 250 μm□, 120 mA for 400 μm□ and 1 A for 1000 m□.

Each component comprising the light emitting element will be now explained hereinafter in detail.

(GaP Substrate 100)

The p-type dopant Zn or Mg is doped in the GaP substrate 100. The GaP bonding layer 101 may be provided on the major surface of the substrate 100. The major surface of the p-type GaP substrate is inclined from the {100} plane to the <011> direction. For example, the major surface inclines at 5 to 30° from (−100) plane into [0-1-1] direction. Since the surface morphology is excellent in a case of the off angle substrate, pits density and hillocks density are less than one order compared to a (−100) plane substrate.

When the wafers are bonded, the pits and hillocks cause the void. Since the wafers are not bonded in the voids, the current do not flow and the chip tends to fall off. The off angle wafer can solve the above problems.

It is desirable that the major surface of the substrate inclines at 15±1° from (−100) plane to [0-1-1], more preferably. The introduction of this plane orientation makes it possible to obtain the fine inequalities on the side surface surely and easily, and the pits and hillocks become half. The thickness of the substrate 100 is desirable to be within a range of 100 μm to 500 μm, more preferably 150 μm to 300 μm. The reason of an upper limit is explained below.

An light absorption in p-type GaP substrate increases in a case of the thicker substrate more than 500 μm, and hence the extracted light is reduced. Although a higher operation current is required up to a few amperes in a case of a traffic signal and a tail lamp of an automobile, the higher current causes a greater heat generation due to the thicker substrate series resistance and hence causes a thermal degradation of the epoxy resin. The reason of the lower limit is explained below. The thinner the substrate, the lower the extraction efficiency due to a light obstruction by the both side electrodes.

(Side Surface of the Substrate 100S)

Inequalities of a few-micrometer depth are formed on the side surface 100S of the substrate with an irregular shape, shown in FIG. 1. Especially, when the major surface of the substrate 100 inclines from the (−100) plane to the [0-1-1] direction, the inequalities can be formed uniformly. Since the incident angle from the inner of the device into the interface varies widely due to the increase of the surface area, a total reflection can be reduced and hence the extracted light increases.

For example, the light emitted from the light emitting layer L1 can be extracted without a total reflection and also the light reflected at the p-side electrode 140 L2 can be extracted through the side surface 100S. In addition, the reflected light L3 at the electrode 140 can be extracted easily without the total reflection through an upper surface 100U because of relatively large incident angle.

If the inequalities are also formed on the upper surface 100U, the higher extraction efficiency is obtained. Another advantage is described below. When this element is encapsulated in epoxy resin, a contact area between the element and the resin increases and hence an adhesion is improved to prevent the chip from falling off. Also since the side surface of the GaP substrate 100S becomes an interface between the semiconductor and an air (or an epoxy resin), a part of the emitted light is absorbed and converted into a heat in the interface. This heat suppresses an optical output from the light emitting device and degrades the resin.

The heat generation can be reduced because the inequalities on the side surface reduce the interface absorption. In addition, when the light emitting is mounted on the lead frame, a conductive adhesion bond such as silver adhesive paste is coated on the p-side electrode 140. If the adhesion bond spreads upward along the side surface 100S, a part of the light can not be extracted. And when the bond spreads over the mesa portion, an electric shortage may occur. According to a first embodiment, since the spread of the bond is suppressed due to inequalities, a fall of the production yield and reliability can be prevented.

The step for forming the inequalities is described below. This surface treatment is a surface-roughening process by which the side surface of the GaP is frosted. First in order to remove a damaged layer on the side surface caused by dicing, the side surface is dipped in a mixed solution of $H_2O_2$, $H_2O$ and HCl of which temperature is controlled between −50° C. and the room temperature for a few to over ten minutes, for example.

Secondly the inequalities are formed by vibrating the element in HF solution controlled between a room temperature and 70° C. for a few to over ten minutes. The forming method is not restricted to the above-mentioned method. For example the dicing damage layer can be removed by using a solution containing chlorine or a gas containing chlorine at least, and the inequalities can be formed by using HF, or a fluorine containing gas, or a fluorine containing solution at least.

(P-Type GaP Bonding Layer 101)

A p-type GaP bonding layer is made of GaP doped with Zn or Mg as a p-type impurity. It is desirable that the thickness of the GaP is within a range of 1 nm to 1 μm, and a carrier concentration is within a range of $1 \times 10^{18}$ to $1 \times 10^{19}$ cm$^{-3}$, more preferably $1 \times 10^{18}$ to $1 \times 10^{19}$ cm$^{-3}$. This bonding layer 101 has a function keeping a voltage drop constant in the bonding interface. For example, the voltage drop can be maintained within a certain allowable range even if the carrier concentration of the GaP substrate is as low as $2 \times 10^{17}$ cm$^{-3}$, wherein the light from the InGaAlP based layer is transparent sufficiently. Also the bonding layer 101 functions as a buffer layer which minimizes the surface effect of the GaP bonding layer to the bonding interface. For example, although the wide variation of the operating voltage occurs in a case of the light emitting device bonded to the GaP substrate directly, such wide variation can be minimized due to the bonding layer 101.

(Bonding Distortion Easing Layer of P-Type InGaP 102)

A bonding distortion easing layer is made of p-type InGaP doped with Zn or Mg as p-type dopant. It is desirable that the thickness of the InGaP is within a range of 1 nm-1 μm, more preferably 1 nm-0.5 μm. Also it is desirable that the carrier concentration is within a range of $1 \times 10^{17}$-$1 \times 10^{21}$ cm$^{-3}$, more preferably $1 \times 10^{18}$-$1 \times 10^{19}$ cm$^{-3}$. This distortion easing layer 102 has a function reducing a crystal distortion caused by direct bonding between the GaP substrate 100 and the light emitting multi-layer of InGaAlP provided on the GaAs tentative substrate (not shown). Since a compound semiconductor including soft In can suppress a growth of the crystal defects into a direction perpendicular to a film surface particularly, the crystal distortion caused by a lattice mismatch and a thermal distortion caused by a different thermal expansion coefficient can be reduced. Therefore, the crystal distortion can not extend to the light emitting layer and hence the light emitting layer does not degrade.

Although the bonding temperature is 400 to 800° C., the temperature greater than 700° C. is desirable, as described later. This reason is because the voltage drop becomes large in a case of the lower temperature. In addition, another reason to use InGaP which do not include aluminum is because hard aluminum reduces the advantage by soft indium. Since this bonding distortion easing layer functions as a light absorption layer at a certain wavelength range, the thickness of the distortion easing layer 102 is desired to be less than dozens nm in a case of a wider well layer band-gap compared to the distortion easing layer band-gap. In this case the crystallinity is not necessarily excellent, but allowed if the required current can flow.

(P-Type Cladding Layer of InGaAlP 103)

A cladding layer 103 is made of p-type InGaAlP doped with Zn or Mg. The thickness is within a range of 0.1-2 μm, and the carrier concentration is within a range of $1 \times 10^{17}$-$1 \times 10^{20}$ cm$^{-3}$. This cladding layer 103 has a wider band-gap than the well layer band-gap of the light emitting layer 106 and a function that the hole-electron pairs injected into the light emitting region are confined in this light emitting region. Since p-type impurity Zn or Mg diffuses during a heat treatment step of substrates bonding, it is desirable that the carrier concentration is less than $5\times10^{19}$ cm$^{-3}$.

(Impurity Diffusion Protecting Layer of a P-Type InGaAlP 104)

An impurity diffusion protecting layer 104 is made of p-type InGaAlP doped with Zn or Mg. The thickness is within a range of 0.1 to 1 μm, and the carrier concentration is within a range of $1\times10^{17}$ to $1\times10^{21}$ cm$^{-3}$. This diffusion protecting layer 104 prevents a p-type impurity diffusion into the well layer of the light emitting layer 106 during the heat treatment step of the substrate bonding. As described hereinbefore, in order to minimize the voltage drop at the bonding interface the heat treatment at a higher temperature than 700° C. is required. If this heat treatment is carried out in an element without the impurity diffusion preventing layer, the impurity in the p-type cladding layer 103 diffuses into the well layer and forms a deep level. Since this deep level acts as a nonradiative center, the light output is reduced.

Since the diffusion preventing layer 104 has an intermediate band-gap between the cladding layer 103 and the well layer, the emitted light from the light emitting layer can be confined in the quantum well layer having a higher refractive index. This means that the light is absorbed again in the quantum well into which the current is not injected. If the refractive index difference is small between the well layer and the diffusion preventing layer, the confined light in the quantum well can be extracted on the side of the p-type cladding layer 103 and the p-type GaP substrate 100. Therefore the light toward the GaP substrate increases and hence a lot of light can be extracted from the GaP substrate.

Especially, in the quantum well structure interposed between the p-type cladding layer and the n-type cladding layer, the diffusion preventing layer including an intermediate refractive index between the well layer and the cladding layer has an effect so that the re-absorption of a light propagating to the edge of the element can be reduced. If the p-type cladding layer 103 comprises a multi-layer, the higher extracted light can be extracted on the GaP substrate side. In this case a first p-type cladding layer 103A adjacent to the diffusion blocking layer 104 is made of InGaAlP having a greater refractive index than the diffusion preventing layer and a second p-type cladding layer 103B adjacent to the first p-type cladding layer is made of InGaAlP having an intermediate refractive index between the well layer and the diffusion preventing layer. Further, if the p-type cladding layer constitution is varied stepwise gradually, the higher extraction efficiency is obtained.

(Light Emitting Layer of a P-Type InGaAlP 106)

A light emitting layer has alternate stacking of p-type well layers of Zn or Mg doped InGaAlP and p-type barrier layers of Zn or Mg doped InGaAlP. It is desirable that the thicknesses of well layers and barrier layers are within a range of 1 nm to 20 nm for a quantum effect. Also it is desired that the carrier concentration of the well layers is within a range of $1\times10^{17}$ to $1\times10^{21}$ cm$^{-3}$ and the carrier concentration of the barrier layer is within a range of $1\times10^{17}$ to $1\times10^{20}$ cm$^{-3}$. When the element has 10 to 80 alternate stacking described above, the light emitting element is achieved which has an excellent light linearity without a light output saturation over a wide injection current range of a few mA to a few A. It is desirable that both ends of the quantum well layers are the barrier layers.

When the light emitting element is bonded to the GaP substrate and the GaP substrate has a certain shape for the higher efficiency, the problem occurs that the reflected light at the bonded interface is re-absorbed in the well layers acting as an absorbing layer. However, if the well layer thickness is less than 10 nm, the light absorption can be reduced when the light is transmitted through the light emitting layer. Also the thinner the well layer, the lower the confinement efficiency. Therefore the light in the well layer can be reduced and hence the re-absorption in the well layer can be minimized. As a result the light generated in the well layer can be extracted effectively. On the other hand, the barrier layer has an intermediate band gap between the well layer and the cladding layer 103. This is because the confinement of the electron-hole pairs in the well layer and the leakage of the light from the well layer are made remarkable. When the impurity is doped highly in the barrier layer, the light absorption becomes eminent due to the impurity level. Therefore it is desirable that the carrier concentration of the barrier layer is less than $5\times10^{19}$ cm$^{-3}$.

(N-Type Cladding Layer of InGaAlP 107)

An n-type cladding layer 107 is made of InGaAlP doped with Si or Se. It is desirable that the thickness is within a range of 0.1 to 2 μm and the carrier concentration is within a range of $1\times10^{17}$ to $1\times10^{21}$ cm$^{-3}$. This cladding layer has a wider band gap than the well layer and the barrier layer of the light emitting layer and a function that the electron-hole pairs are confined in the light emitting layer including MQW layer.

(N-Type Current Diffusion Layer of InGaAlP 108)

An n-type current diffusion layer 108 is made of InGaAlP doped with Si or Se. It is desirable that the thickness is within a range of 0.5-4 μm and the carrier concentration is within a range of $1\times10^{17}$-$1\times10^{21}$ cm$^{-3}$. This current diffusion layer 108 has a narrower band gap than the cladding layer 107 and the band gap is as wide as the light from the light emitting layer including the MQW layer is not absorbed. The current diffusion layer 108 has a function that an injected current from the electrode 110 is spread out over the entire light emitting layer including MQW having a greater area than the electrode. Also the current diffusion layer has a function that the emitted light toward the n-type cladding layer 107 is extracted to the surface of the GaP substrate because of the small refraction index difference to the light emitting layer. When the current diffusion layer is highly doped with the impurity, the crystallinity becomes poor due to the lattice mismatch. Therefore, it is desirable that the carrier concentration is less than $1\times10^{21}$ cm$^{-3}$ for the thickness less than 2 μm, and is less than $1\times10^{19}$ cm$^{-3}$ for the thickness of 2 to 4 μm.

(N-Type GaAs Contact Layer 109)

It is desirable that the contact layer 109 is made of n-type GaAs doped by Si or Se, the thickness is within a range of 1-100 nm, and the carrier concentration is within a range of $1\times10^{18}$-$1\times10^{21}$ cm$^{-3}$. The contact layer has a role to reduce a contact resistance to the n-side electrode. However, since the contact layer material such as GaAs absorbs the emitting light, the thickness is desired to be less than dozens nm to minimize the absorption effect. If the contact layer is made of InGaP, then the absorption can be reduced preferably. When the contact layer is provided on the entire current diffusion layer 108 and its thickness is between 0.05 and 0.1 μm, the light emitting device is achieved having low optical absorption characteristic and a low operation voltage due to the lower resistance caused by current diffusion effect.

(N-Side Electrode 110)

A n-side electrode 110 is made of the material including Au and Ge. In order to suppress a metal migration Mo may be used sometimes. The electrode 110 comprises a bonding pad having a thickness of 1 to a few μm, and several stripe portions extending outward having a thickness of several hundred nm.

When an ultrasonic power and a bonding weight are not applied appropriately, the bonding crack may occur in the interface surface of wafer bonding during Au wire bonding step. If the thickness of the contact layer 109 is within a range of 0.1 to 0.5 μm and the thickness of the current diffusion layer 108 is within a range of 0.5 to 2 μm, then the above-mentioned problem is solved and a long-term stable operation becomes possible.

(P-Side Electrode 140)

A p-side electrode is made of the material including Au and Zn, and shows an excellent ohmic characteristic because a part of Zn diffuses into the GaP substrate. In order to obtain better adhesion between the adhesive bond and the mounting part 160, the thickness of the p-side electrode 140 is desired to be a range of 0.1 to a few μm.

(Mesa Portion of InGaAlP 120)

If an area of the mesa portion 120 including the light emitting layer 106 is smaller than that of the GaP substrate 100, the effect of the damage layer caused by forming the side surface and the inequalities can be reduced and the degradation by the crystal defect can be suppressed. Also, if an area of the mesa portion is 60-90% of the major surface of the GaP substrate 100 approximately, the current concentrates appropriately, and hence the higher light emitting efficiency and the higher output are obtained.

Figure 2:
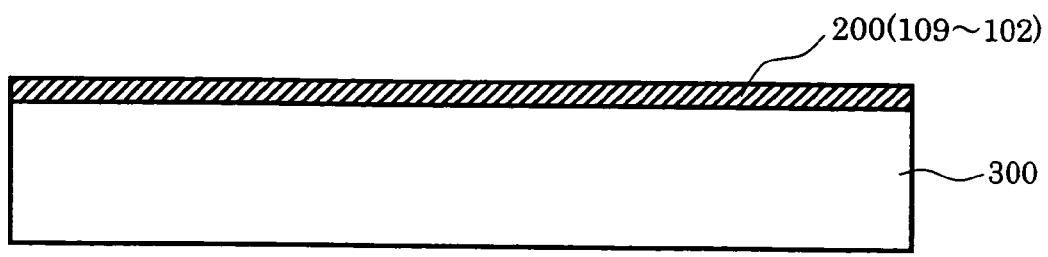
FIG. 2 is a cross-sectional view of a wafer after the step of growing the light emitting multi-layer.
Figure 3:
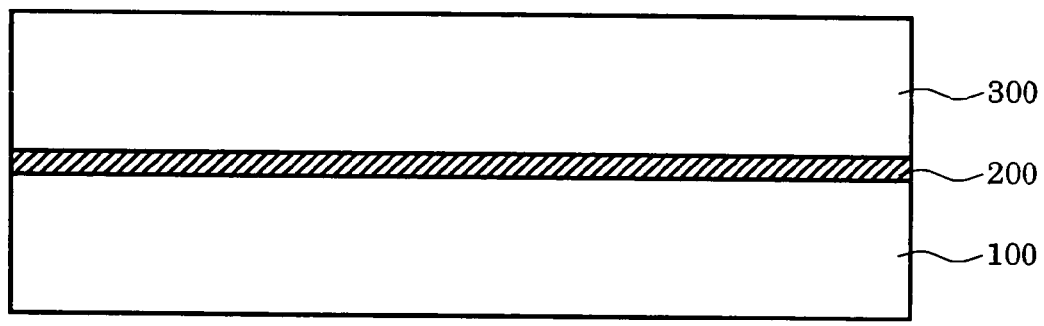
FIG. 3 is a cross-sectional view of a wafer after the step of bonding wafers.
Figure 4:
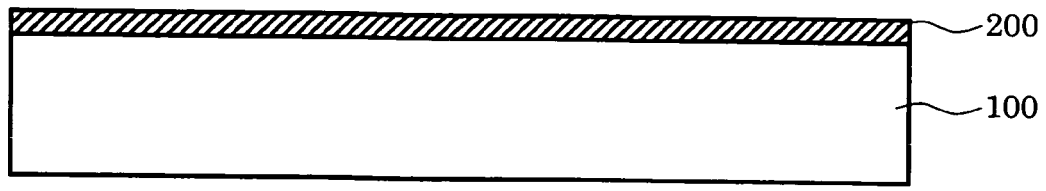
FIG. 4 is a cross-sectional view of a wafer after the step of removing a GaAs substrate.

A method for manufacturing the light emitting element according to a first embodiment will be now described hereinafter. FIGS. 2 through 4 show the steps of a wafer bonding, and each figure is a cross-sectional view of a wafer. As shown in FIG. 2, a semiconductor multi-layer 200 (including an n-type contact layer 109 to a bonding distortion easing layer 102) is formed on an n-type GaAs substrate 300 by MOCVD (metal-organic chemical vapor deposition). As an example the step for forming the cladding layer 107 is explained below. $PH_3$ and metal-organic gases such as trimethylgallium (TMG), trimethylindium(TMIn) and trimethylaluminum (TMA), along with a hydrogen carrier gas and a $SiH_4$ n-type doping gas, are introduced into a reactor. When the growth is carried out at the temperature 500-900° C., a 0.5 μm thick n-type cladding layer 107 of $In_{0.49}(Ga_{0.3}Al_{0.7})_{0.51}P$ is obtained having the concentration of $1.0\times10^{16}$-$1.0\times10^{19}$ $cm^{-3}$. DMZ is also used for a p-type doping gas. As shown in FIG. 3, a GaP substrate 100 is bonded to the surface of the multi-layer 200 which is grown on the GaAs substrate 300. Before this bonding a bonding layer 101 of Zn-doped GaP having a thickness of 1 nm to 1 μm is formed on the GaP substrate 100 by MOCVD. In this case the layer can be grown epitaxially by introducing TMG, TMZn and $PH_3$, along with $H_2$ carrier gas, into the reactor, at the temperature of 500 to 900° C. On this bonding step the multi-layer 200 is superposed upon the GaP bonding layer 101, and heated at 700° C. approximately under a pressure of 0.1-10 $kg/cm^2$. Subsequently, the GaAs tentative substrate 300 is removed with a mixed solution of $H_2O_2$ and $NH_3$ containing water, as shown in FIG. 4.

Figure 5:
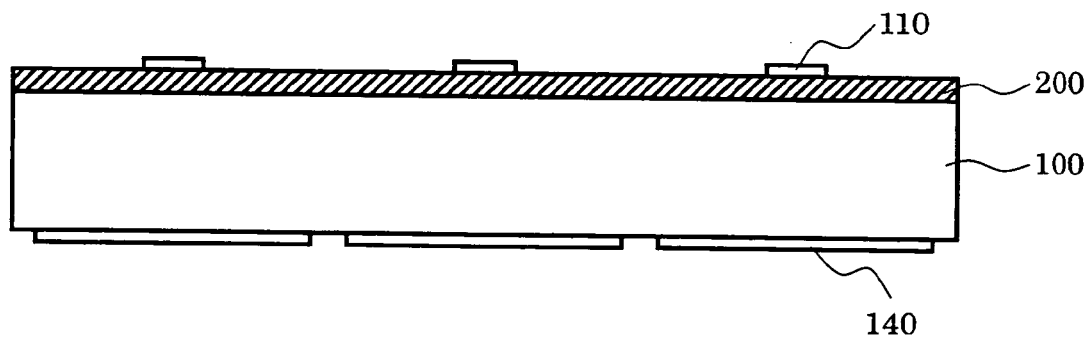
FIG. 5 is a cross-sectional view of a wafer after the step of patterning the electrodes.
Figure 6:
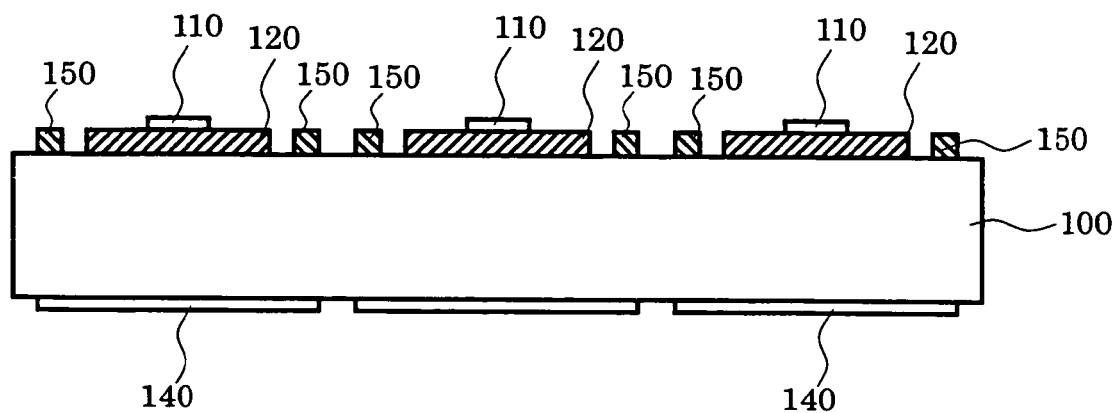
FIG. 6 is a cross-sectional view of a wafer after the step of patterning the multi-layer.
Figure 7A:
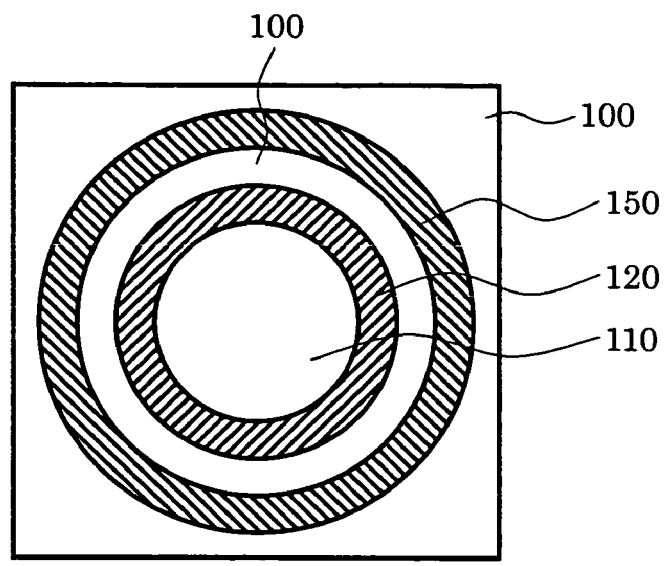
FIG. 7A is a plan view of the element of FIG. 6.
Figure 7B:
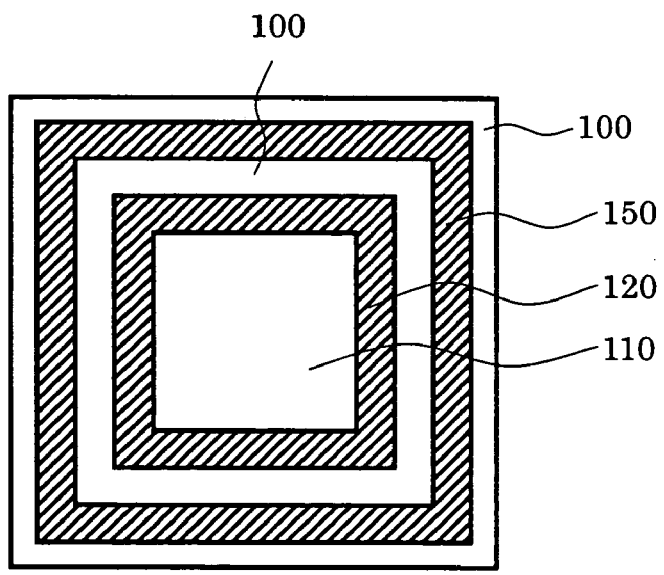
FIG. 7B is a plan view of the element of FIG. 6.
Figure 8:
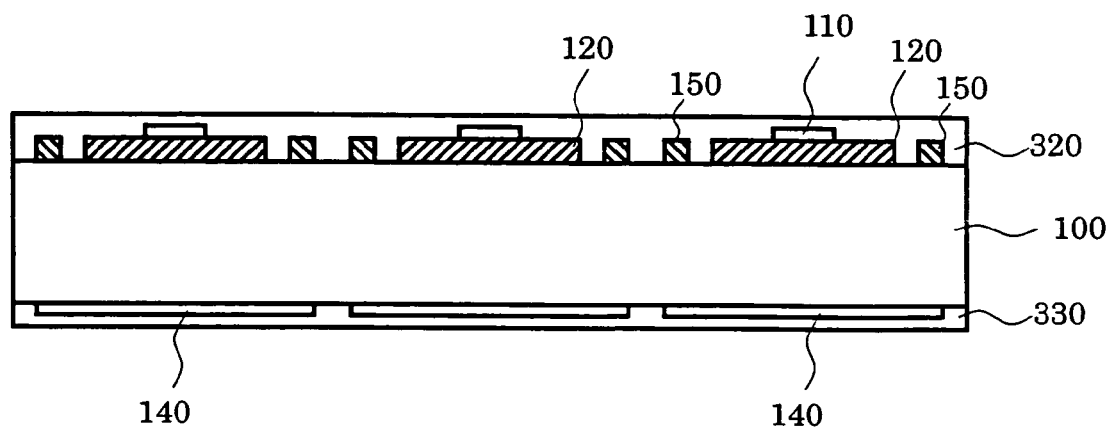
FIG. 8 is a cross-sectional view of a wafer after coating the photoresist.
Figure 9:
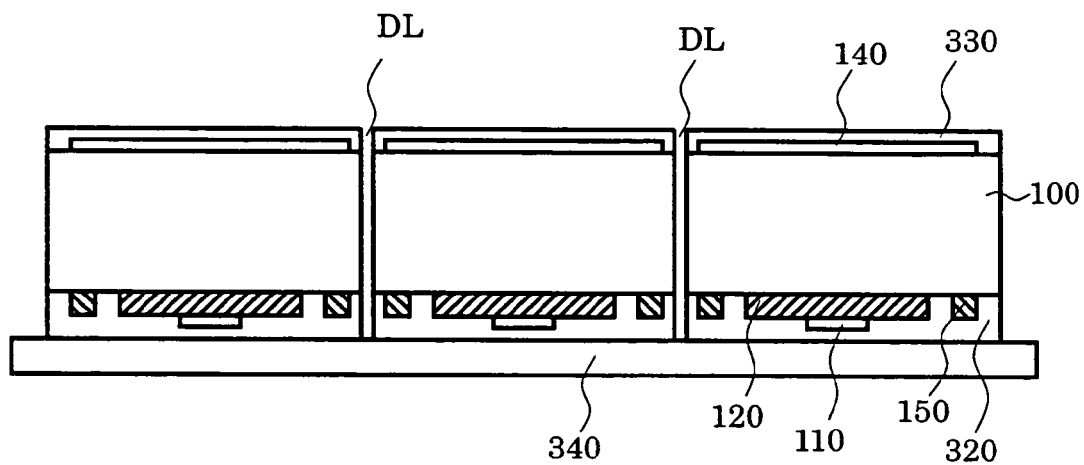
FIG. 9 is cross-sectional view of a wafer after the step of dicing.
Figure 10:
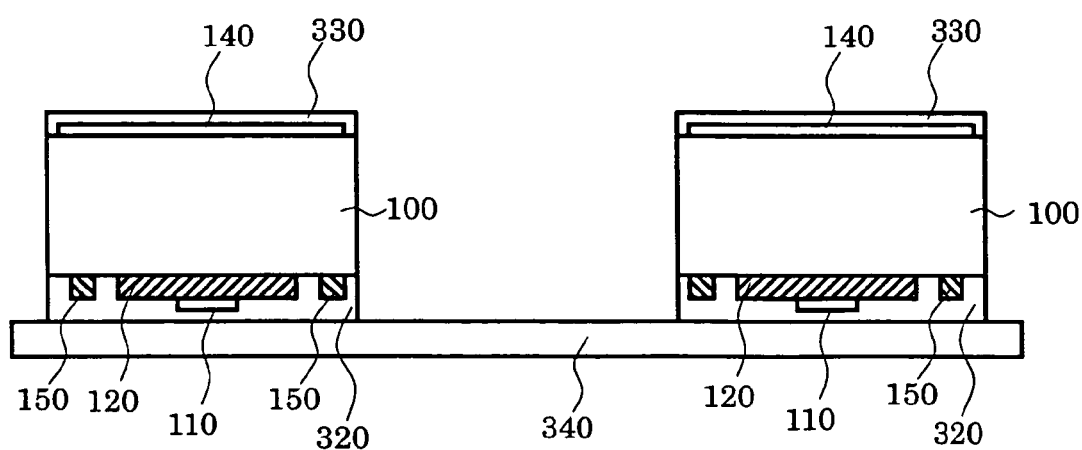
FIG. 10 is a cross-sectional view of the element after expanding.

FIGS. 5 through 13 show the steps for forming inequalities and fabricating the device. As shown in FIG. 5, an n-side electrode 110 is formed on the surface of the multi-layer and a p-side electrode 140 is formed on the bottom surface of the GaP substrate 100. FIG. 6 is a cross-sectional view of the bonded wafer after patterning the multi-layer 200.Then the mesa portion 120 and a surrounding wall 150 which surrounds the mesa portion are formed. FIG. 7A is a plan view which shows a surrounding wall of a ring configuration. Also FIG. 7B is a plan view which shows a surrounding wall of a hollow square. FIG. 8 is a cross-section of a wafer of which both surfaces are covered with photoresist 320 (n-side) and photoresist 330 (p-side) for a protection. Subsequently, the wafer is bonded to a tape 340 and dicing is carried out, as shown in FIG. 9. Since the mesa portion 120 is located in an inner region of e dicing line DL in this step, the light emitting layer is free from the damage and crystal degradation caused by dicing and hence the degradation of the light emitting characteristic can be avoided. FIG. 10 shows the cross-section of the chip after expanding for a chip separation. A damage layer caused by dicing on the side surface 100S is removed by etching and the inequalities are formed on the side surface 100S.

Figure 11:
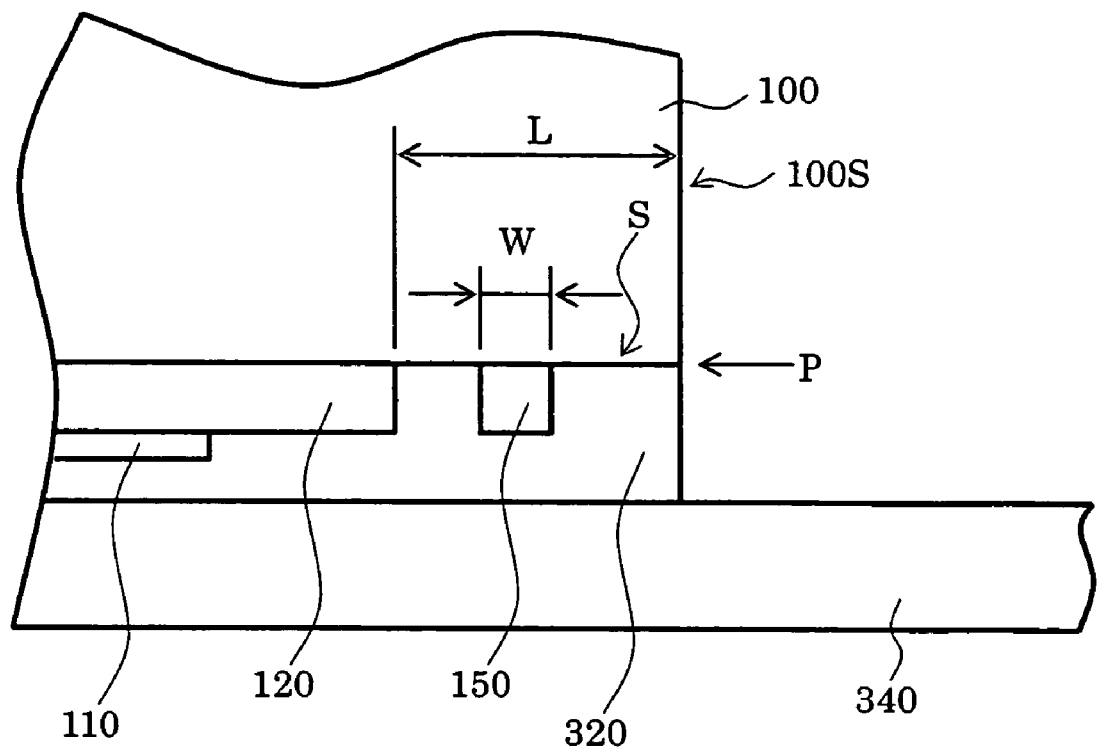
FIG. 11 is a graphic representation showing an enlarged element.
Figure 12:
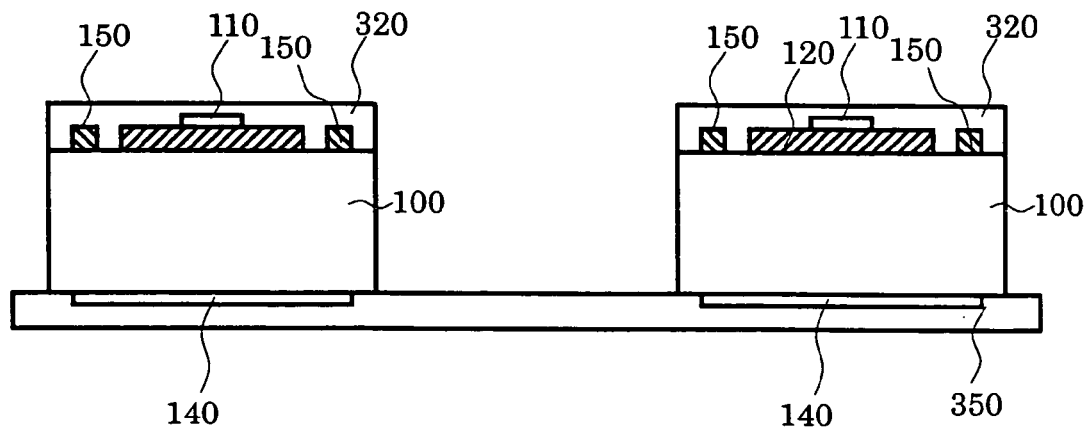
FIG. 12 is a cross-sectional view of an element after bonding to the tape on the opposite side.
Figure 13:
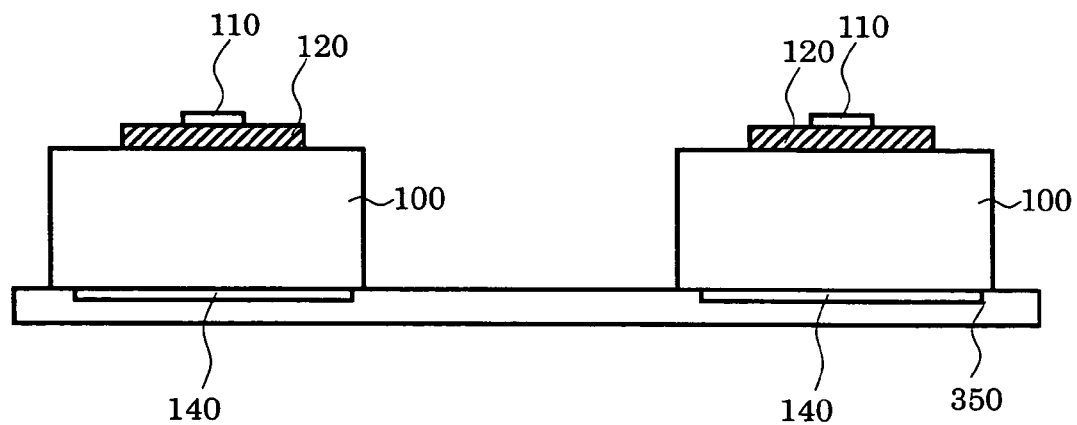
FIG. 13 is a cross-sectional view of a element after removing the photoresist.

The reason why the surrounding wall 150 is necessary is explained below. FIG. 11 is a cross-sectional view of the chip enlarged partly. When the chip is dipped in HF solution, HF solution penetrates into the inner portion through the phtoresist-GaP interface. The inventors found that the mesa portion might be corroded away by penetrating HF solution even if the distance between the edge of the mesa portion 120 and the side surface 100S of the GaP substrate was 50 μm without the surrounding wall. When the mesa portion is corroded by HF, the light emitting characteristic is degraded. According to a first embodiment the HF penetration can be prevented by the surrounding wall having the same material as the mesa portion. The inventors found by an experiment that the corrosion of the mesa portion could be avoided by preventing HF penetration in the etching step for forming inequalities when the width W of the surrounding wall 150 was between 5 and 10 μm. Subsequently the photoresist 330 on p-side is removed and the chips are bonded to another tape 350, as shown in FIG. 13. When the photoresist 320 is removed, the light emitting device is obtained. In addition, the surrounding wall 150 is removed with the photoresist sometimes and remains on the substrate sometimes. And a part of the surrounding wall may remain. This is because the surrounding wall is etched to some extent by the penetrating HF solution and the determination of removal or remaining depends on the extent of etching. When the width of the surrounding wall is relatively large, the remaining possibility increases.

Figure 14:
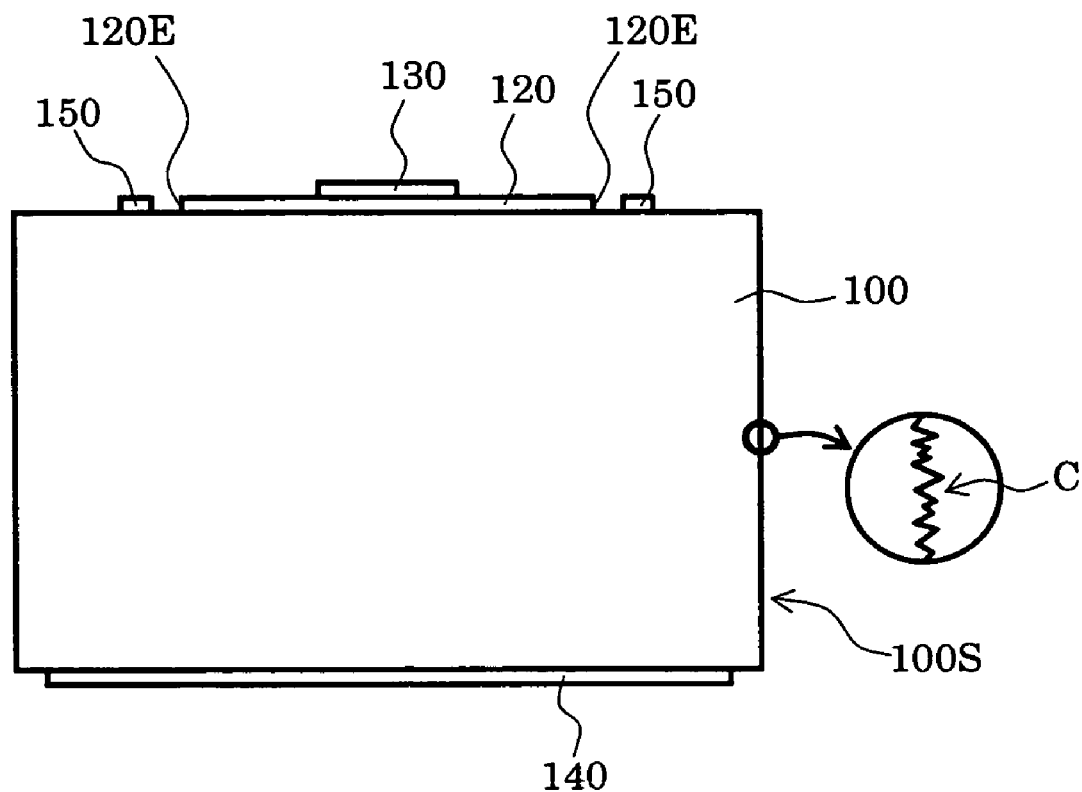
FIG. 14 is a cross-sectional view of the element according to a first embodiment of the invention.
Figure 15:
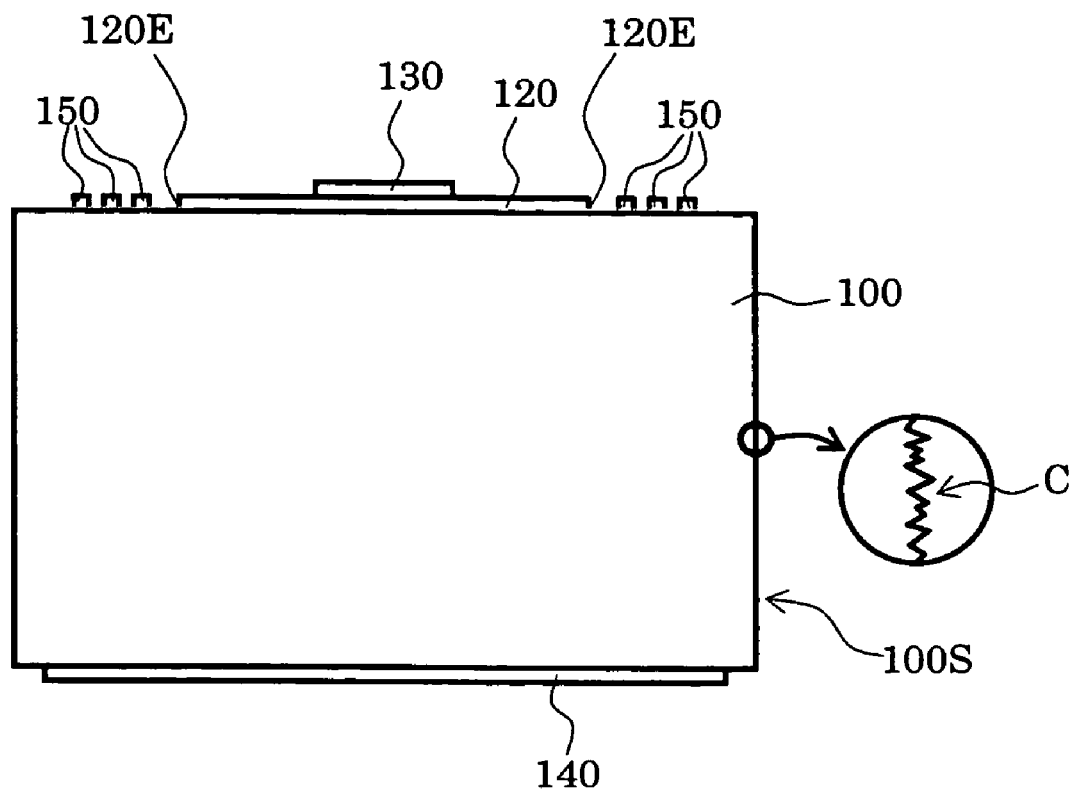
FIG. 15 is a cross-sectional view of the modified element according to a first embodiment.

FIG. 14 is a cross-sectional view of the light emitting device having a remaining surrounding wall. If the surrounding wall disappears after removing photoresist, the stress caused by thermal expansion coefficient difference tends to concentrate in the edge 120E of the mesa portion 120 in a case of the device encapsulated in the epoxy resin. By the concentration of stress in the edge, a recombination by the current injection is reinforced there, the temperature rises in the edge and hence the degradation of the light emitting element may start from the edge 120E in some cases. On the contrary, if the surrounding wall 150 remains after etching, the stress caused by epoxy resin to the edge 120E of the mesa portion 120 can be eased. As a result, if the current is injected into the vicinity of the edge, the element degradation does not occur. Since the light absorption near the edge of the mesa portion is suppressed and the temperature rise is suppressed, the optical output can be increased. FIG. 15 is a cross sectional view of the device having a few surrounding walls. These walls can reinforce the effect of preventing HF penetration and easing the epoxy resin stress.

SECOND EMBODIMENT

Figure 16:
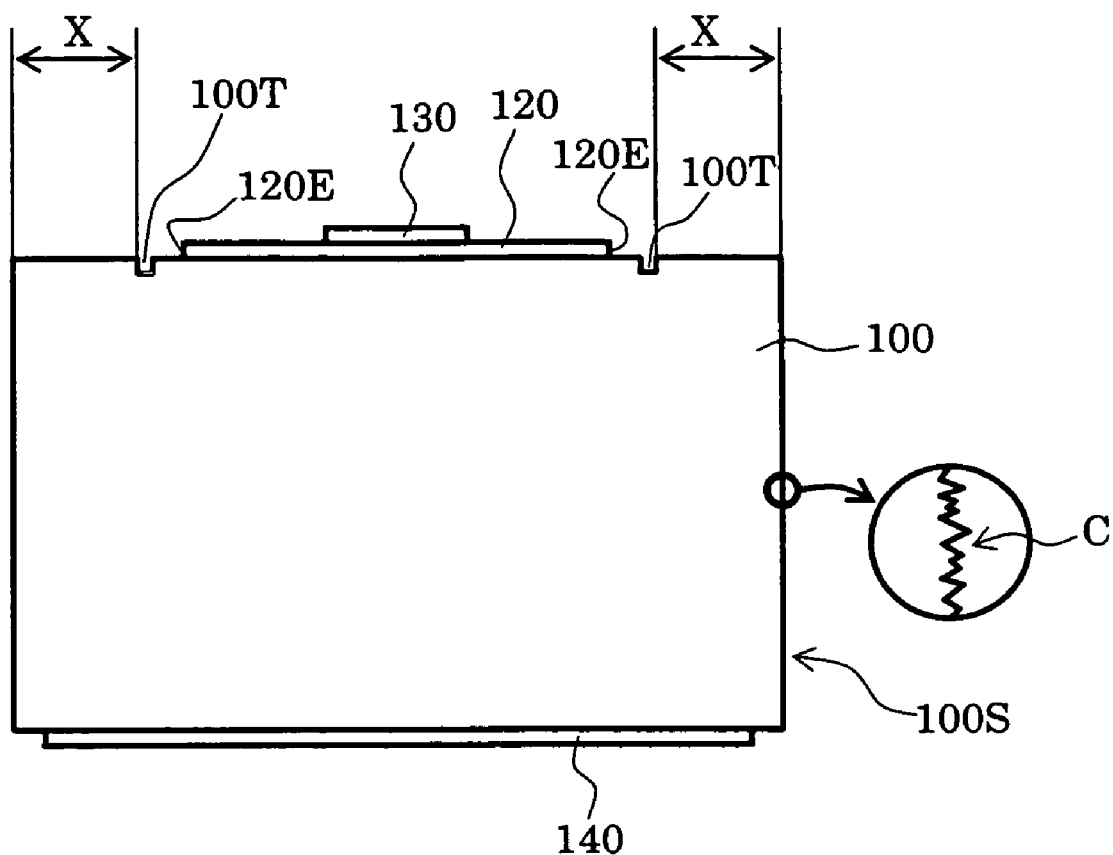
FIG. 16 is a cross-sectional view of a element according to a second embodiment.

FIG. 16 is a cross-sectional view of the light emitting element according to a second embodiment of the invention. This element provides a trench 100T so as to surround the mesa portion on the surface of the GaP substrate 100. This trench 100T has a function preventing HF solution penetration during forming inequalities.

Figure 17A:
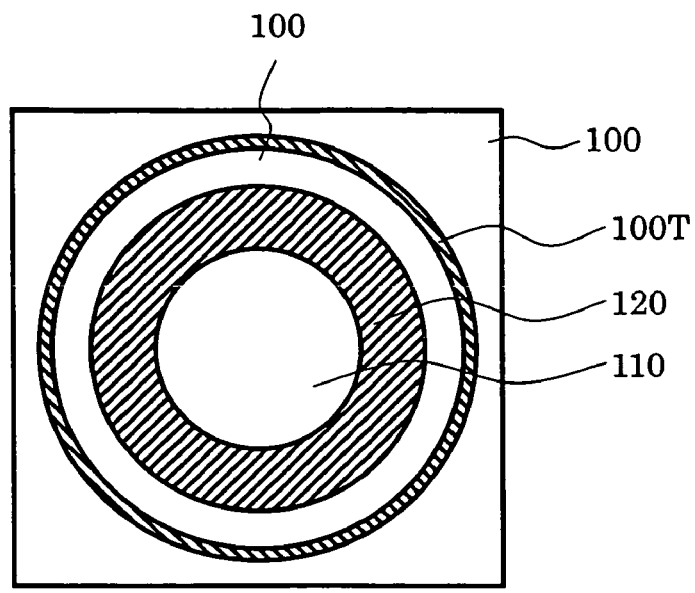
FIG. 17A is a plan view of an element of FIG. 16.
Figure 17B:
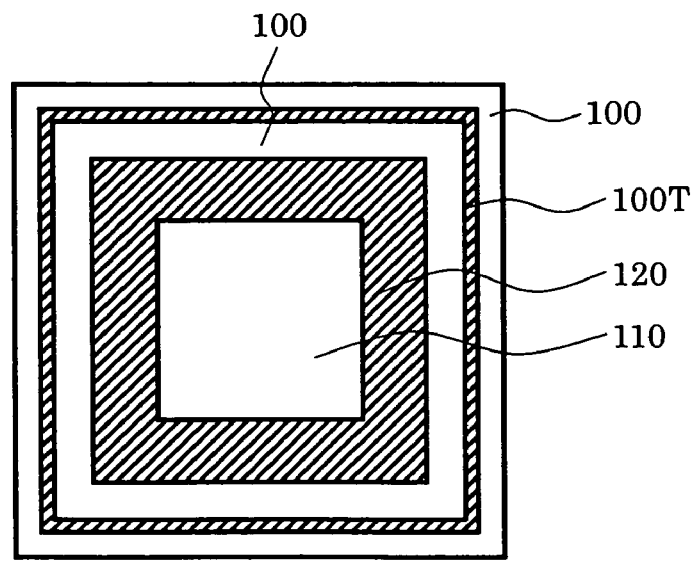
FIG. 17B is a plan view of an element of FIG. 16.
Figure 18:
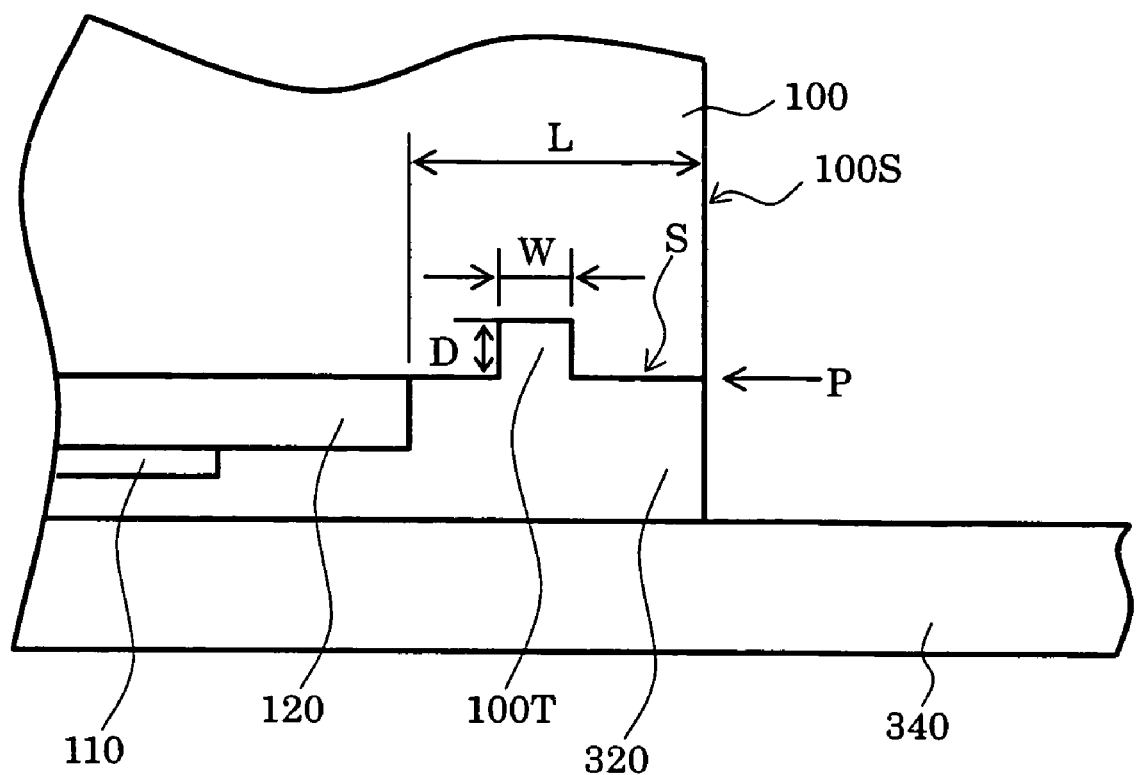
FIG. 18 is a graphic representation showing an enlarged element.

FIG. 17A is a plan view of the element of FIG. 16, having a ring configuration trench. Also FIG. 17B is a plan view of the element of FIG. 16, having a hollow square configuration trench. FIG. 18 is a cross-sectional view of the element enlarged partly. According to this embodiment it makes possible to obtain the longer interface distance between the photoresist 320 and the substrate 100 by the trench 100T. As shown by an arrow P, when HF solution penetrates into the interface, the penetrate path becomes longer by the trench. As a result, the corrosion by HF solution can be suppressed. Also since the epoxy resin is injected into the trench and cured, the resin is fixed tightly in the trench region. As a result, the stress to the edge 120E toward X-direction shown in FIG. 16 is reduced much. Consequently, the degradation of the light emitting characteristic caused by the edge stress can be reduced as explained in FIG. 14.

There is provided the light emitting element having the higher efficiency by reinforcing the light emission near the edge 120E. In order to obtain the better effect the width W and the depth D may determined appropriately so that the photoresist and the epoxy resin can be injected into the trench. The effect becomes eminent if the depth D is greater as far as the trench is filled with the resist and the resin.

Figure 19:
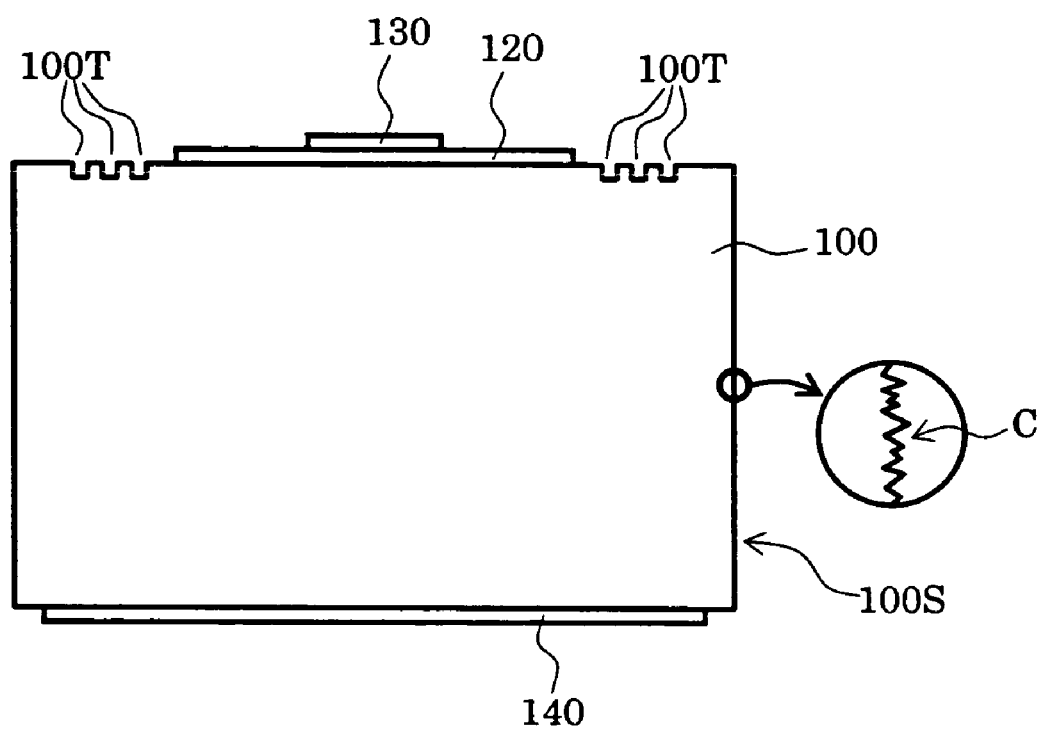
FIG. 19 is a cross-sectional view of the modified element according to a second embodiment.

FIG. 19 is a cross-sectional view of the modified element according to a second embodiment. This device has a few trenches around the mesa portion. These trenches can reinforce the effect of preventing HF penetration and easing the epoxy resin stress further.

THIRD EMBODIMENT

Figure 20:
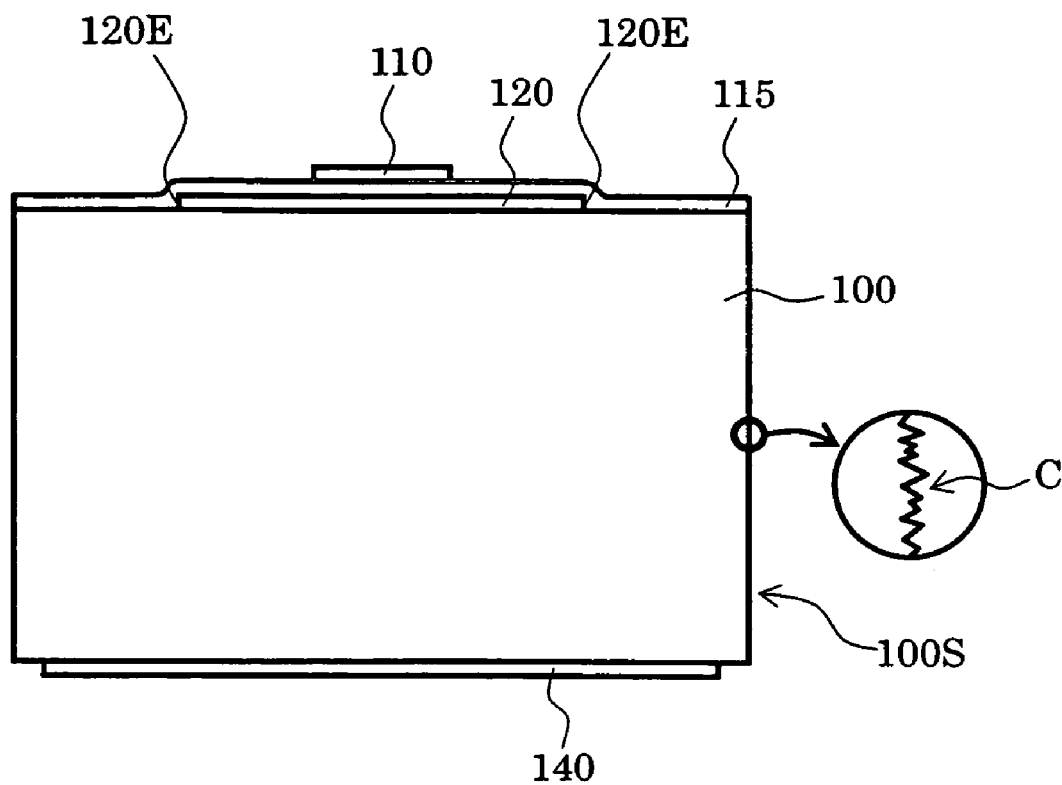
FIG. 20 is a cross-sectional view of a element according to a third embodiment.
Figure 21:
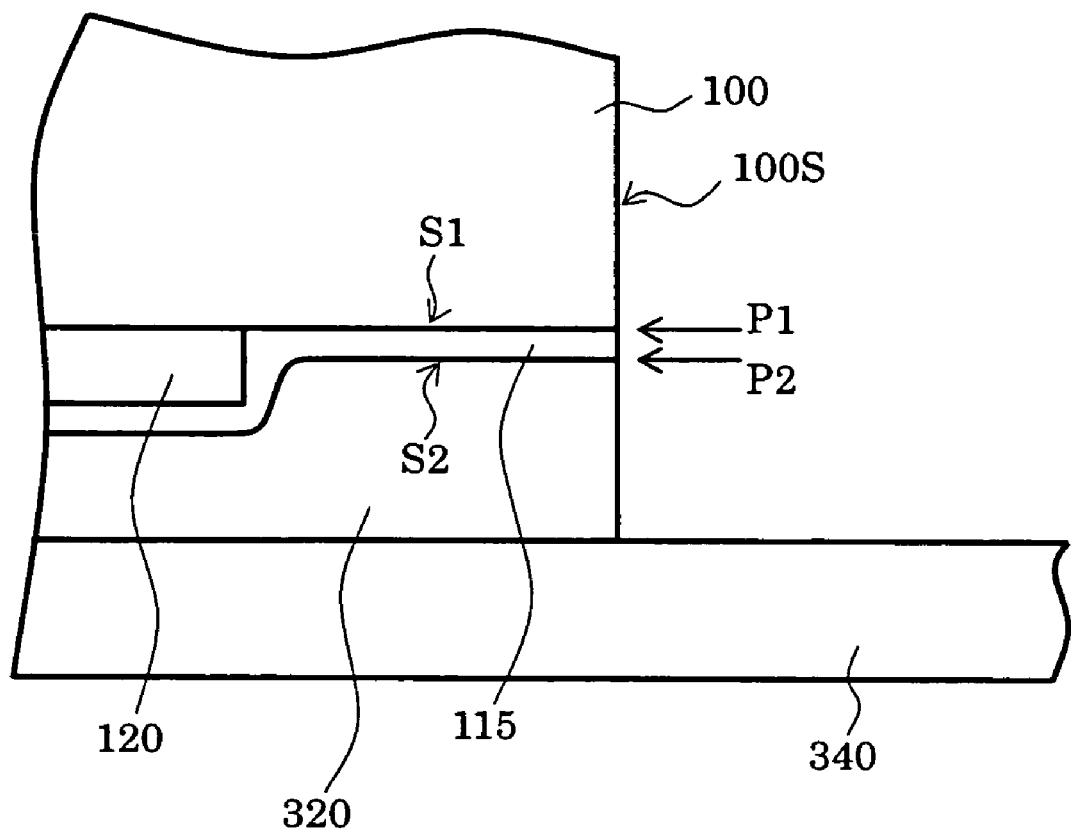
FIG. 21 is a graphic representation showing a enlarged element.

FIG. 20 is a cross-sectional view of the light emitting element according to a third embodiment of the invention. The n-type GaP layer 115 covers the entire mesa portion 120. FIG. 21 is a cross-sectional view of the element enlarged partly.

Since an interface S1 between the GaP substrate 100 and the n-type GaP layer 115 is constituted of the same material, HF solution does not penetrate into the interface. HF solution can not penetrate through path P1 and hence the mesa portion can be protected. HF solution may penetrate into the inner region through the interface S2 between the n-type GaP layer and the photoresist 320 in some cases. However, even if HF solution penetrates into the inner region through path P2, the mesa portion can be protected due to the n-type GaP layer 115.

Figure 22:
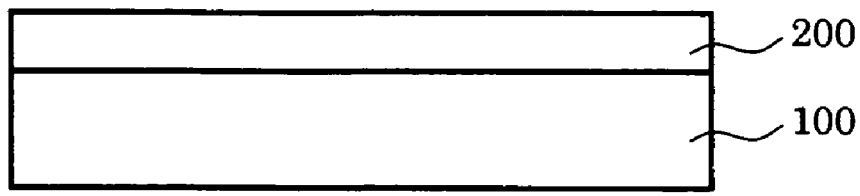
FIG. 22 is a cross-sectional view of a wafer after bonding wafers.
Figure 23:
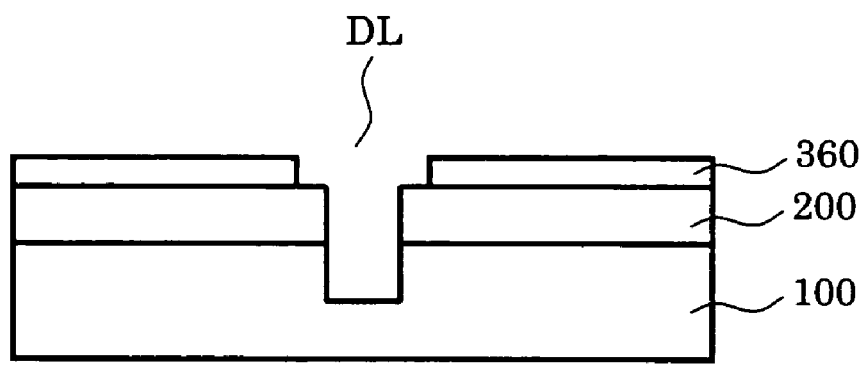
FIG. 23 is a cross-sectional view of a wafer after dicing.

The method for manufacturing the element according to a third embodiment will be explained below. FIGS. 22 through 29 show the steps of fabricating the element. FIG. 22 is a cross-sectional view of a wafer after bonding. FIG. 23 is a cross-sectional view of the wafer after dicing. After a photoresist 360 is patterned, a half-cut dicing is carried out to the depth of 10 to 20 μm and the width of 40 to 50 μm.

Figure 24:
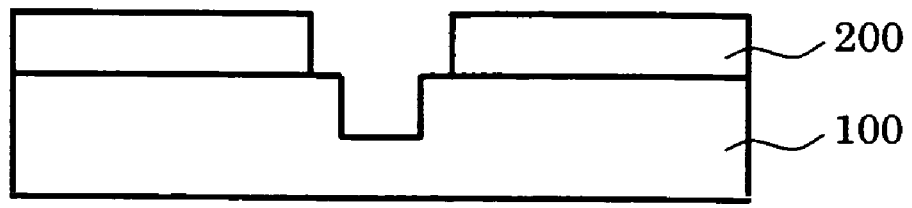
FIG. 24 is a cross-sectional view of a wafer after removing the damaged layer.
Figure 25:
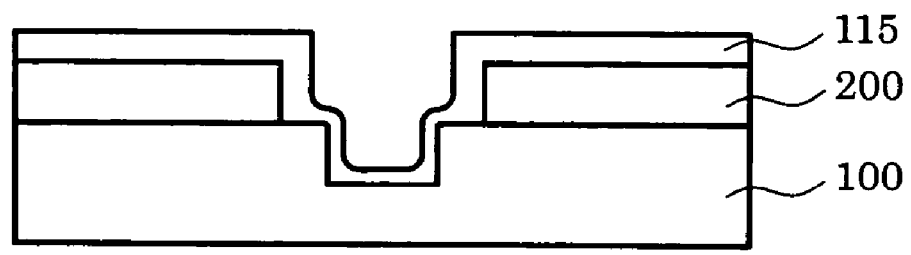
FIG. 25 is a cross-sectional view of the wafer after forming an n-type GaP layer.

Subsequently, the damaged layer by dicing is removed by a mixed solution of HCl, $H_2O_2$ and $H_2O$ (where HCl: $H_2O_2$: $H_2O$=95:2:3), for 10-30 minutes, as shown in FIG. 24. The resist 360 is removed using the solution for this purpose. The dicing line DL may be formed by RIE. For example the above-mentioned dicing line can be formed using a mixed etching gas of $Cl_2$, $BCl_3$, Ar and $O_2$ under a pressure of 10 to 100 mTorr and a RF power of 100-500 W for 10-30 minutes. Subsequently, an n-type GaP layer is grown epitaxially using MOCVD on the multi-layer and the dicing line, as shown in FIG. 25.

Since the lattice mismatch is large between the multi-layer 200 and the n-type GaP layer, the GaP layer 115 having excellent morphology is obtained by adding the graded layer (lattice mismatch easing layer). For example there is provided a $In_{0.49}(Ga_{0.3}Al_{0.7})_{0.5}P$ having a carrier concentration of $1\times10^{16}$ to $1\times10^{19}$ $cm^{-3}$ and a thickness of 0.1 to 2.0 μm, a graded layer of changing constitution from $In_{0.49}(Ga_{0.3}Al_{0.7})_{0.5}P$ to GaP by gradually reducing Al and In by using a ramping function of a mass flow controller, and an n-type GaP layer having a carrier concentration of $1\times10^{16}$ to $1.0\times10^{19} cm^{-3}$ and a thickness of 2.0 to 10.0 μm epitaxially.

Figure 26:
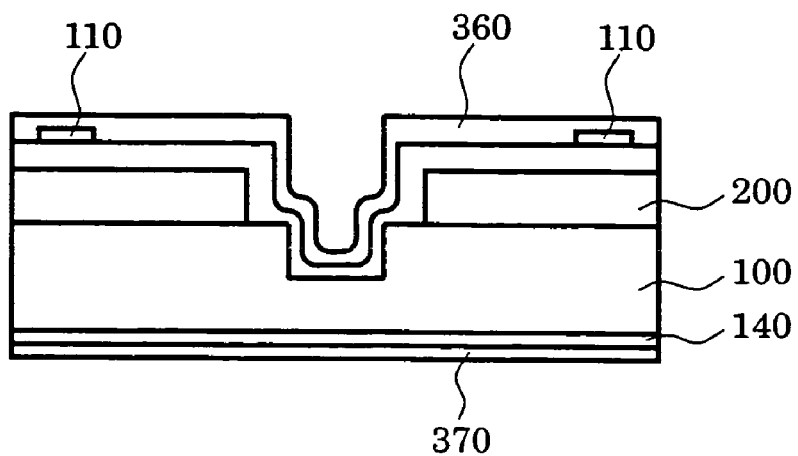
FIG. 26 is a cross-sectional view of the wafer after coating photoresist.
Figure 27:
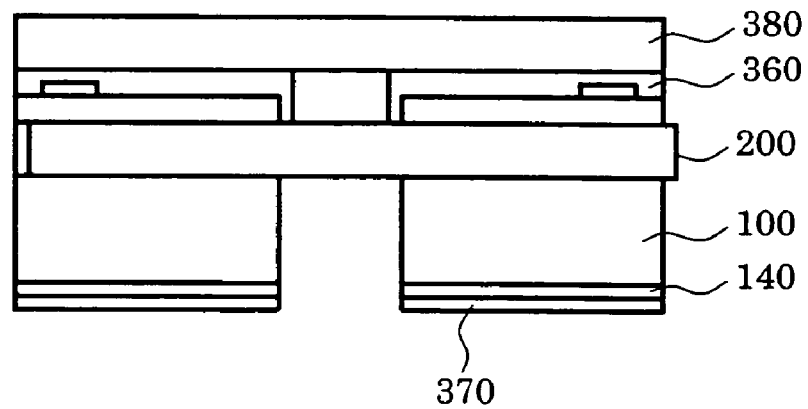
FIG. 27 is a cross-sectional view of the element after second dicing.

Subsequently, an n-side electrode 110 is formed by patterning a Au—Ti alloy layer or a Au—Ge alloy layer deposited on the n-type GaP layer 115. Also a p-side electrode 140 is formed by a deposition of an Au—Zn alloy layer on the opposite surface of the GaP substrate 100. The photoresist 370 and 360 are coated on the p-side electrode and the n-side electrode for the protection, respectively, as shown in FIG. 26. The surface of the photoresist 360 on the n-side electrode is bonded to a tape 380 and the dicing of the opposite surface of the GaP substrate is carried out perpendicularly to obtain a rectangular solid chip, as shown in FIG. 27.

Figure 28:
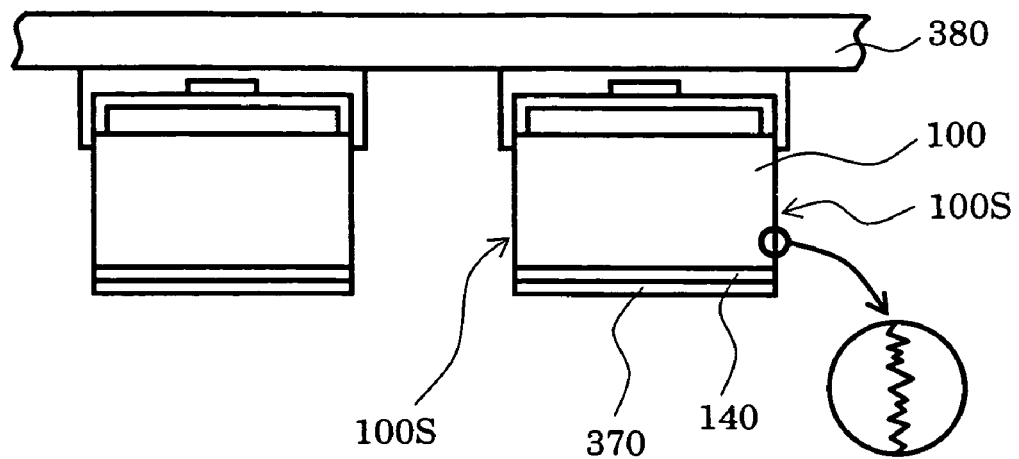
FIG. 28 is a cross-sectional view of the element after surface-roughening.

After a tape expansion the damaged layer is removed by a mixed solution, wherein HCl: $H_2O_2$:$H_2O$=95:2:3. The chips on the tape 380 are dipped in $NH_4F$ solution for 10-30 minutes as preprocessing. The inequalities can be formed uniformly by this preprocessing. Within 10 seconds after the preprocessing the chips are dipped in the solution of HF with concentration at 10 to 49% for 10-30 minutes. Then the inequalities having about 1-micrometer depth and the irregular spacing of about 0.5-1.0 micrometers are formed on the side surface 100S of the GaP substrate 100, as shown in FIG. 28. In other words, the side surface is frosted due to inequalities.

Figure 29:
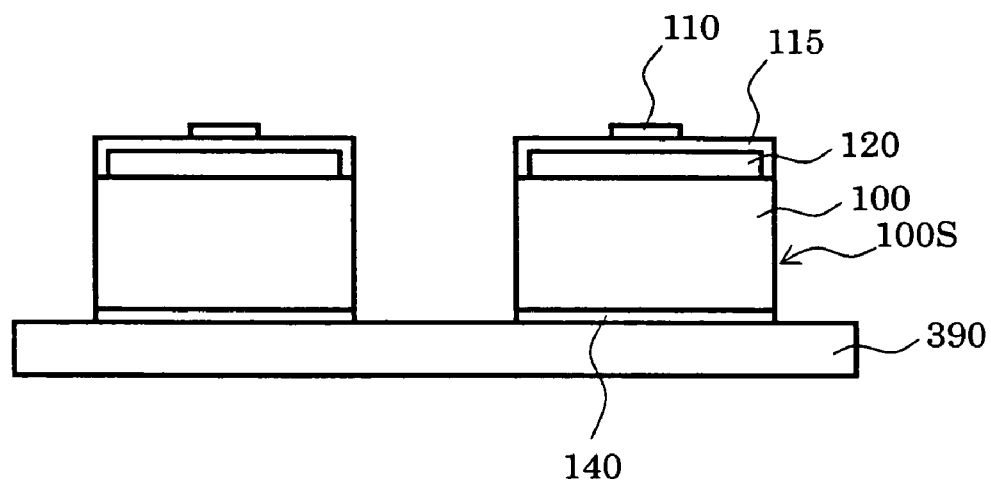
FIG. 29 is a cross-sectional view of the element after bonding to a tape on the p-side.

After this step the photoresist 370 is removed using an appropriate solution and the p-side electrode 140 is bonded to another tape 390. FIG. 29 is a cross-sectional view of the light emitting device on the tape. According to this embodiment the corrosion of the mesa portion is prevented by protecting with the n-type GaP layer during frost treatment step and hence the stable frost forming step becomes possible.

FOURTH EMBODIMENT

Figure 30:
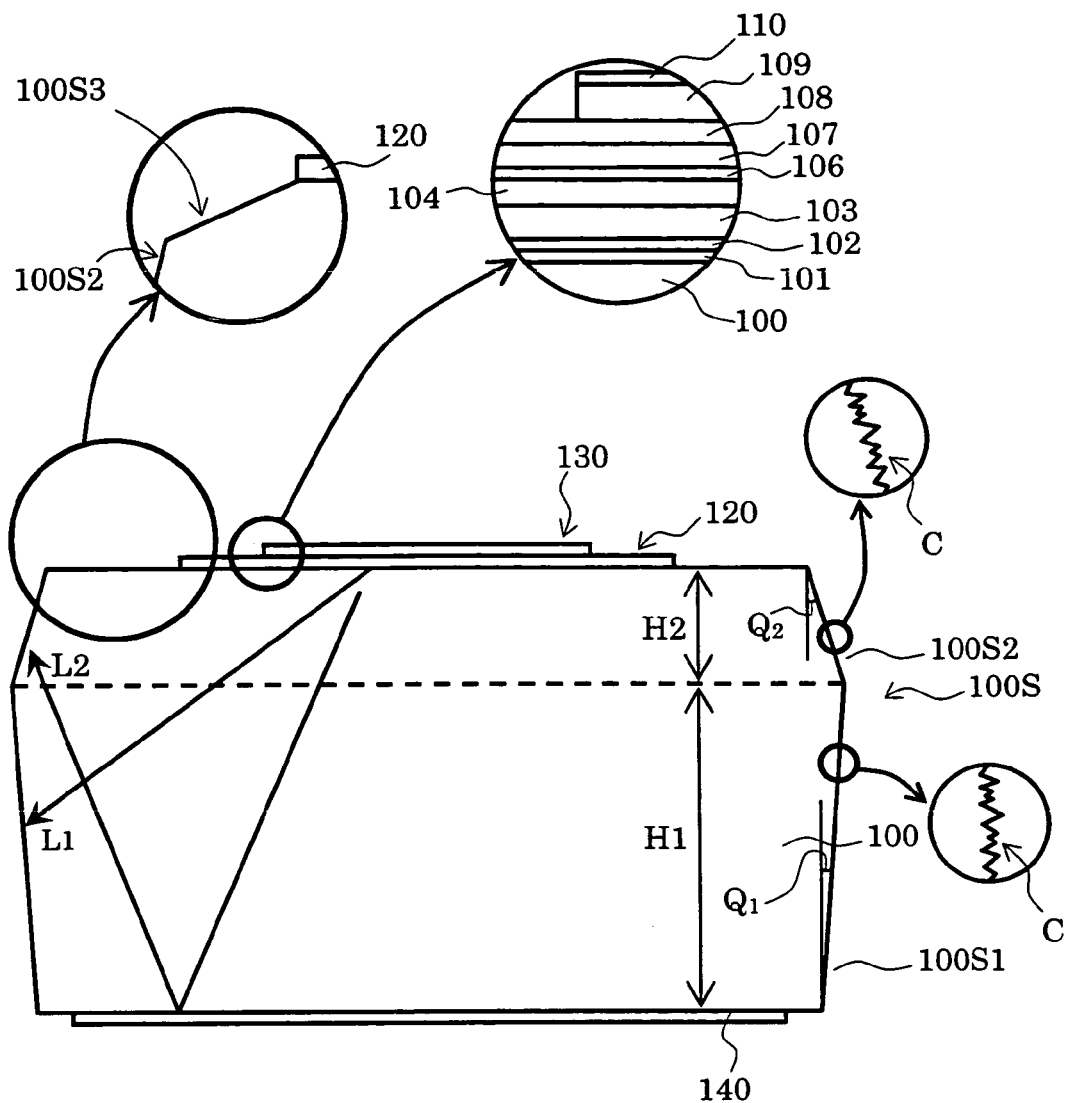
FIG. 30 is a cross-sectional view of the element according to a fourth embodiment.

FIG. 30 is a cross-sectional view of the light emitting element according to a fourth embodiment of the invention. In this embodiment the side surface 100S includes a first tapered portion 100S1 and a second tapered portion S2. The first tapered potion 100S1 is widening toward the mesa portion 120 (or upward) Since an angle of an incident light L1 into the tapered portion 100S1 is changed, the total reflection is suppressed further.

On the other hand, the second tapered portion 100S2 becomes narrow toward the mesa portion 120. Even if the stress is applied to the side surface of the GaP substrate by the epoxy resin for an encapsulation, this tapered portion 100S2 can reduce the stress which lifts up the chip and remove it from a mounting part such as a lead frame. Item 100S3 corresponds to a top surface of the substrate 100.

Consequently, by providing the first and second tapered portions of which inclined directions are opposite each other, the light extraction efficiency is improved. And since the adhesion between the resin and the light emitting element chip is also improved, a breakaway is prevented between the resin and the light emitting element chip. Simultaneously, since the resin stress to the light emitting element is divided upward and downward, the degradation of the light emitting element caused by the stress can be reduced.

The optimum structural parameters will be explained hereinafter. It is desirable that the height H1 of the lower GaP substrate portion having the tapered potion 100S1 is a range of 60 to 260 μm, and an angle Q1 between a surface of the tapered portion and a plane perpendicular to the major surface of the GaP substrate is within a range of 2 to 15° in the cross-section. When the angle Q1 become greater, the light emitting element may break away from the lead frame due to the resin stress and hence the failure by disconnection may occur.

It is further desirable that the height H1 is within a range of 100 to 220 μm, and the angle Q1 is within a range of 3 to 10°, considering the above-mentioned failure, an easiness of chip manufacturing method, an easiness of assembling and a cost. On the other hand it is desirable that the height H2 of the upper GaP substrate portion having the taper portion 100S2 is within a range of 10 to 90 μm and the angle Q2 is within a range of 5 to 80°. And it is further desirable that H2 is within a range of 40-70 μm and Q2 is within a range of 30-60°. This tapered portion 100S2 has an effect reducing the breakaway of the chip caused by the resin stress and has a function that the angle of the reflected light L2 from the p-side electrode 140 is changed so as to obtain the higher extraction efficiency. The first and the second tapered portion can be formed by respective dicing steps.

For example, the second tapered portion 100S2 is formed by dicing the wafer with a prescribed depth from the n side in FIG. 8. Then the angle Q2 can be controlled by selecting an appropriate blade edge angle. Next the first tapered portion 100S1 can be formed by dicing the wafer with a prescribed depth from the p side. The angle Q1 can be controlled by selecting an appropriate blade edge angle.

FIFTH EMBODIMENT

Figure 31:
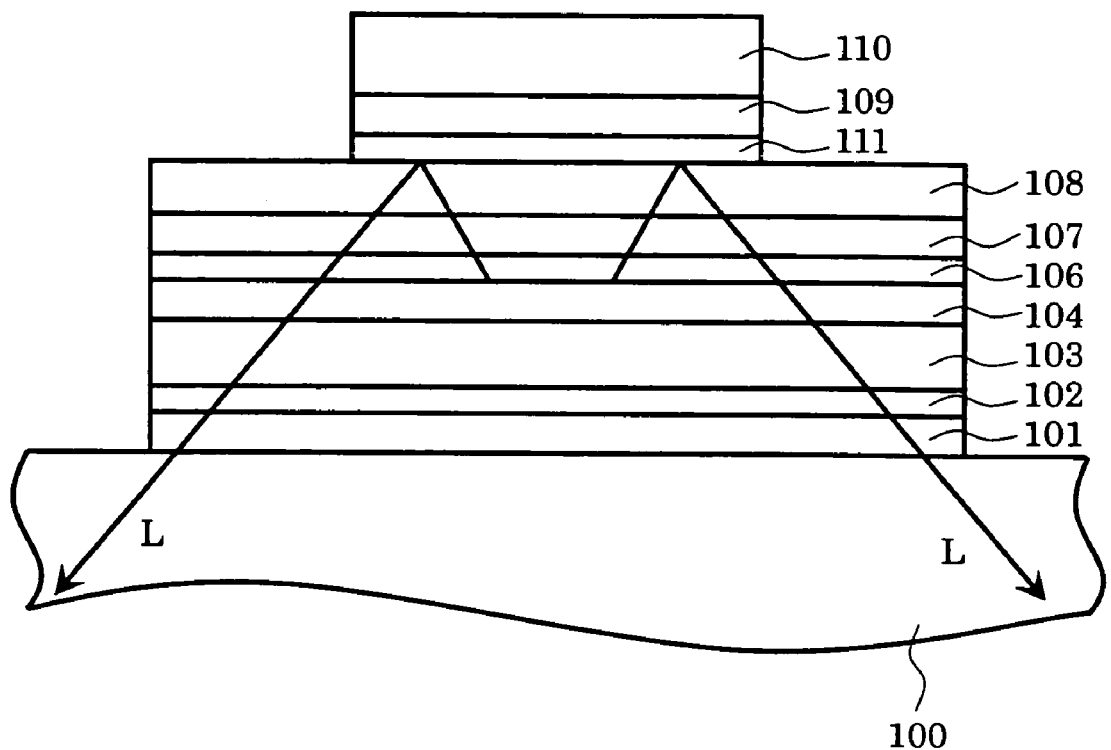
FIG. 31 is an enlarged cross-sectional view of the element according to a fifth embodiment.

FIG. 31 is a cross-sectional view of the light emitting element according to a fifth embodiment of the invention. In this figure the mesa portion is enlarged.

Figure 32:
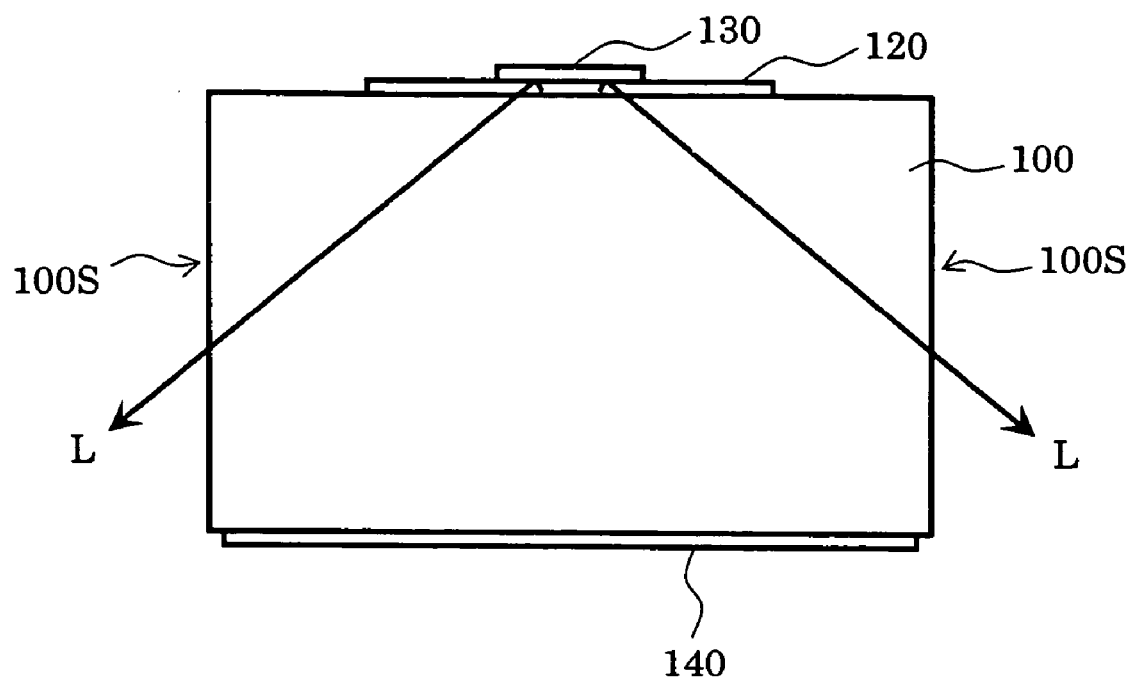
FIG. 32 is a cross-sectional view of the element according to a fifth embodiment.

FIG. 32 is a cross-sectional view of whole chip structure. In this embodiment the reflecting mirror 111 interposes between the n-type contact layer 109 and the n-type current diffusion layer 108. The reflecting mirror, for example, is a Bragg reflection mirror which is an alternate stacking of two kinds of semiconductor layers having an optical thickness of a quarter wavelength of the light from the emitting layer 106. Specifically, the alternate stacking of an InAlP layer and a GaAs layer is used.

Figure 33:
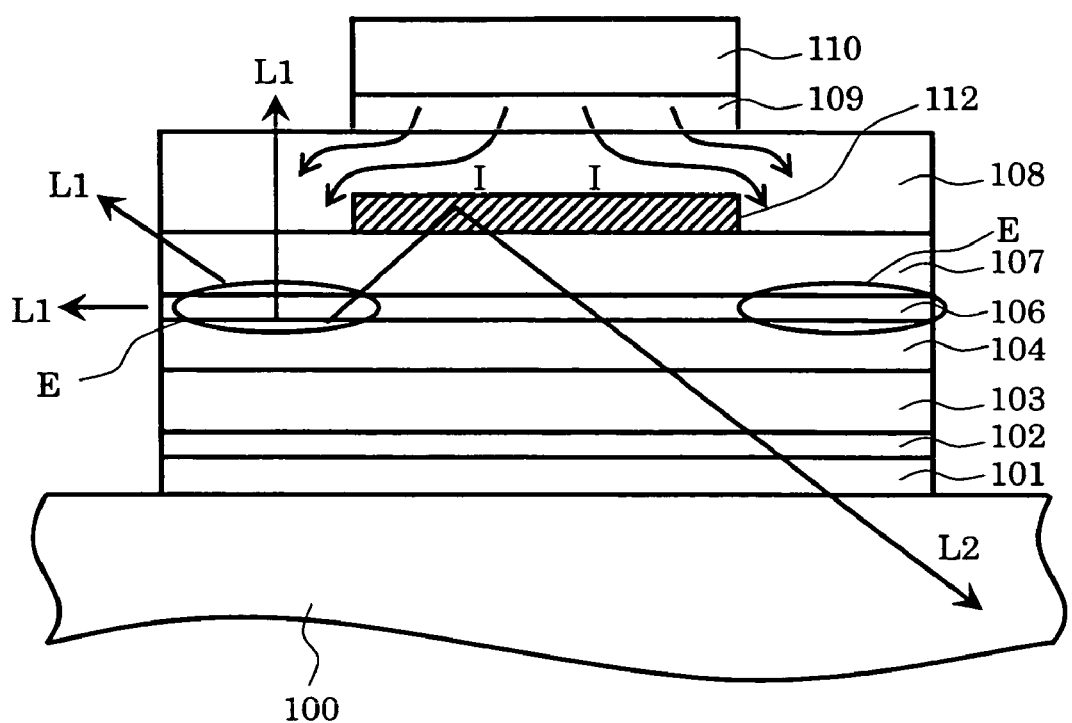
FIG. 33 is a graphic representation explaining the structure of the modified element.

Since an alloyed layer between the n-side electrode 110 and the contact layer 109 is formed, the reflection coefficient is reduced in some cases. On the contrast, since the light L toward the n-electrode 110(or upward) can be reflected efficiently, the light L can be extracted through the side surface 100S. FIG. 33 is an enlarged cross-sectional view of the modified device according to the fifth embodiment.

In this embodiment the current blocking layer 112 is interposed between the current diffusion layer 108 and the n-type cladding layer 107. The current blocking layer 112 is disposed in the position facing to the n-type electrode 108 so that the current injected via the n-side electrode is blocked. The current I injected via the n-side electrode spreads around the current blocking layer 112 and forms the light emitting region E in the periphery of the mesa portion 120.

Since light emitting region E is formed in the outside of the n-side electrode substantially, the light L1 which is emitted upward or toward the edge can be extracted without the interference by the electrode 110 and hence the extraction efficiency is improved. If the light reflecting structure shown in FIGS. 31 and 32 is used for the current blocking layer, the light L2 emitted from the region E is reflected by the current blocking layer 112 efficiently and can be extracted through the side surface 100S efficiently.

SIXTH EMBODIMENT

A sixth embodiment is a semiconductor light emitting device in which the light emitting element chip according to a first to fifth embodiment is encapsulated in the epoxy resin with another parts such as lead frames.

Figure 34:
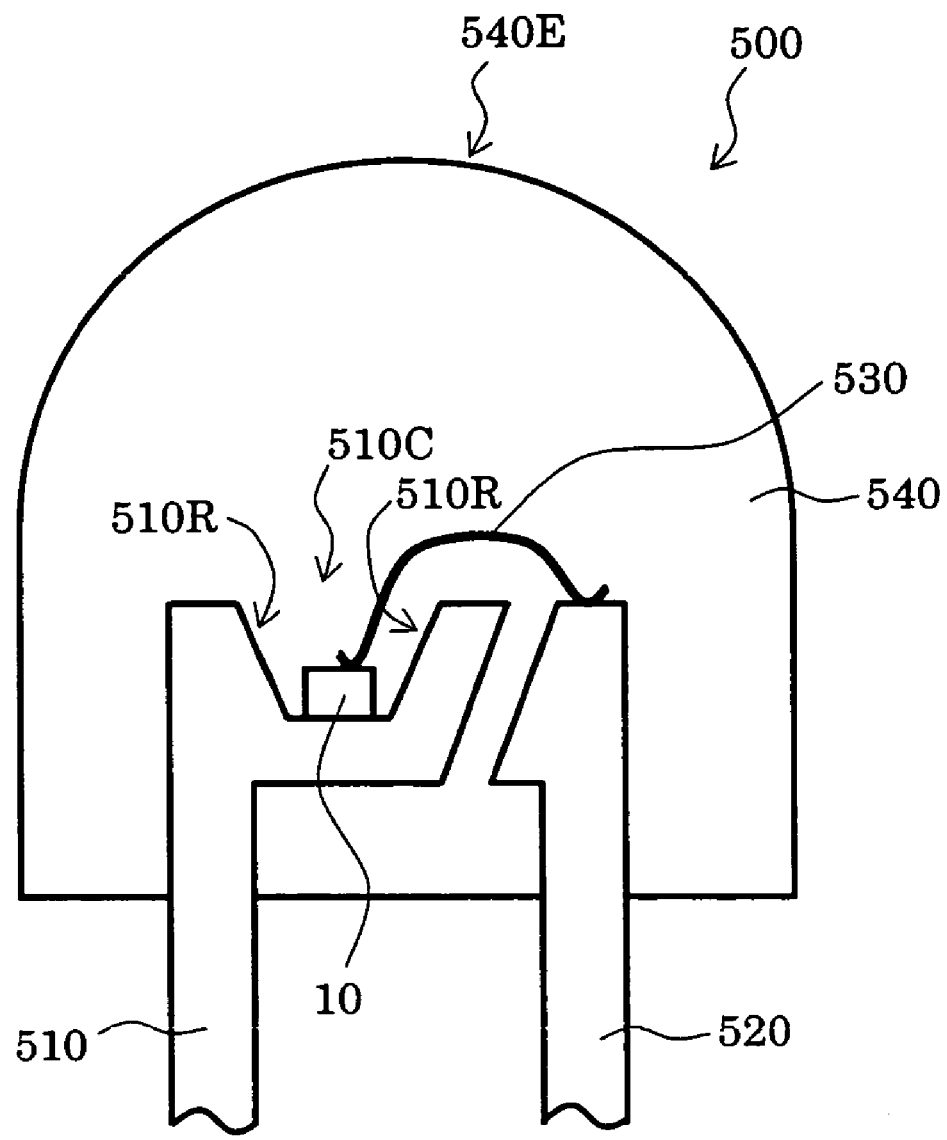
FIG. 34 is a cross-sectional view of the first example of the device according to a sixth embodiment.

FIG. 34 is a cross-sectional view of a first example according to a sixth embodiment. This device is encapsulated in the epoxy resin and has an "artillery shell" shape. Items 500 and 540E correspond to the semiconductor light emitting device and the light extracting surface of the device, respectively. The light emitting diode 10 is mounted on the top portion of a lead frame 510 by using the adhesion bond and a p-side electrode is connected with a top portion of the other lead frame 520 by a bonding wire 530.

The top portion of the lead frame 510 has a tapered inner surface 510R which reflects the light upward. A cap portion 510C is formed by the transparent epoxy resin 540. Since the top portion of the cap forms a curvature for collecting a light, the predetermined viewing angle can be obtained by collecting the light from the device 10 appropriately.

In this example the higher intensity is obtained by using the light emitting element chip shown in FIGS. 1 through 33. The light emitted from the side surface 100S is reflected by the reflecting surface 510R and extracted via the resin 540. AS mentioned above, since the adhesion between the light emitting element chip and the epoxy resin 540 is improved due to the inequalities on the side surface of the GaP substrate, the breakaway of the chip can be suppressed. If the resin stress to the edge 120E is eased by the structure shown in FIGS. 14, 16 and 20, the degradation of light emitting characteristic can be reduced and the reliability is improved.

Figure 35:
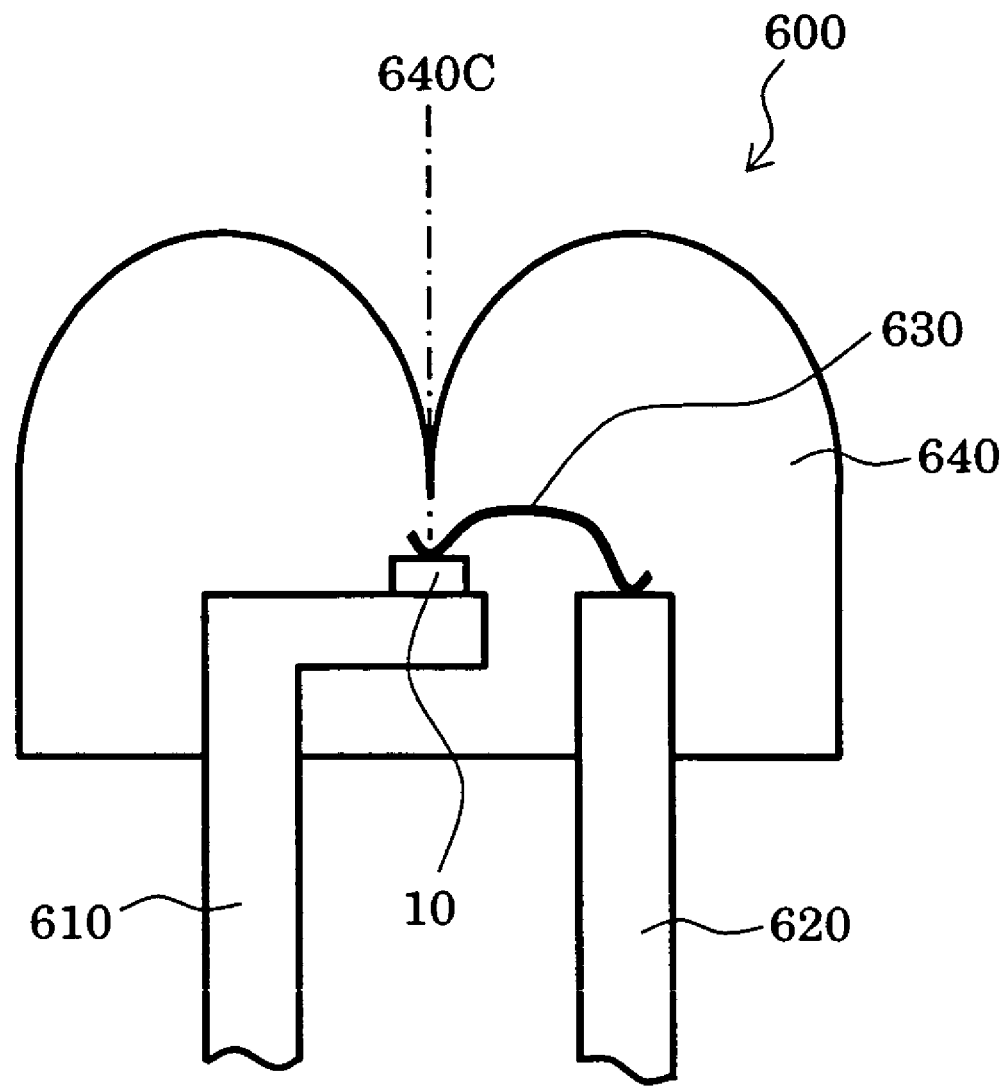
FIG. 35 is a cross-sectional view of the second example of the device according to a sixth embodiment.

FIG. 35 is a cross-sectional view of the second example according to a sixth embodiment. Item 600 corresponds to the semiconductor light emitting device. The chip 10 is mounted on a lead frame 610, and is connected with the other lead frame 620 by bonding wire 630. The epoxy resin 640 has a rotation symmetry shape around a center axis 640C and has a concave portion. The wide angle of emission is obtained due to this shape.

Figure 36:
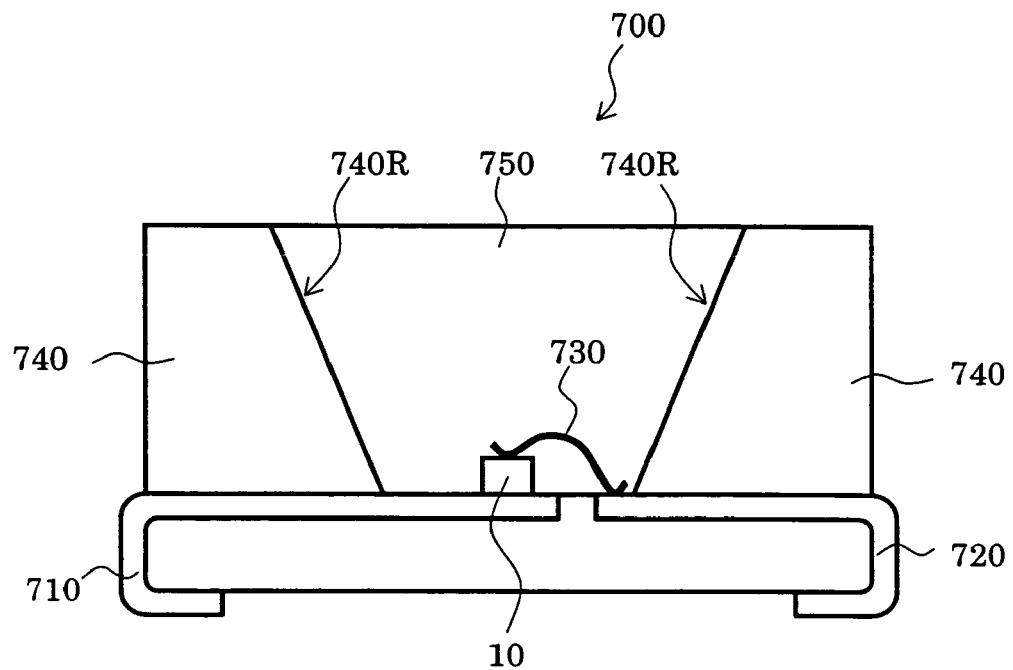
FIG. 36 is a cross-sectional view of the third example of the device according to a sixth embodiment.

FIG. 36 is a cross-sectional view of a third example. This device is called the surface mounted device. Item 700 corresponds to the semiconductor light emitting device. The chip 10 is mounted a lead frame 710 and connected with the other lead frame 720 by bonding wire 730. The lead frame 710 and 720 are buried with a first epoxy resin 740 and the chip 10 is encapsulated with a transparent second resin 750. The higher reflectivity is obtained by distributing the fine titanium oxide particles in the first resin. And the tapered surface 740R reflects the emitted light and guides outward.

Figure 37:
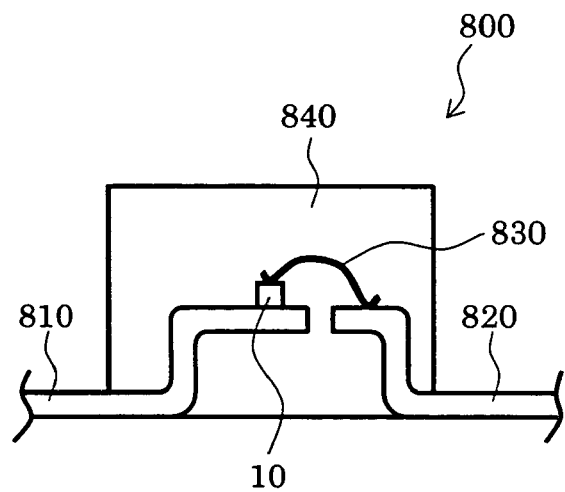
FIG. 37 is a cross-sectional view of the fourth example pf the device according to a sixth embodiment.

FIG. 37 is a cross-sectional view of the fourth example. This is also surface mounted device. Item 800 corresponds to the semiconductor light emitting device. The chip 10 is mounted on the lead frame 810 and connected with the other lead frame 820 by bonding wire 830. The chip 10, the lead frames 810 and 820, and the bonding wire are encapsulated in the transparent resin 840.

Additional advantages and modifications will readily occur to those skilled in the art. More specifically a various kinds of structures such as a double hetero junction and MQW, materials, and device shapes can be used.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A light emitting element comprising:
    a GaP substrate including:
        a major surface inclined to the <011> direction from the {100} plane, the major surface being substantially flat;
        a side surface covered with inequalities substantially; and
        an opposite surface opposite to the major surface,
    a mesa portion provided on the major surface and having a light emitting multi-layer of InGaAlP based material;
    a first electrode provided on the light emitting multi-layer; and
    a second electrode provided on the opposite surface of the GaP substrate,
    wherein
    a part of a light emitted from the light emitting multi-layer is extracted through the side surface of the GaP substrate,
    a width of the mesa portion is smaller than a width of the major surface of the GaP substrate in any cross-section,
    a part of the major surface of the GaP substrate is exposed without being covered with the mesa portion, and
    the side surface of the GaP substrate includes:
        a first tapered portion adjacent to the opposite surface of the GaP substrate, the first tapered portion being covered with the inequalities substantially; and
        a second tapered portion adjacent to the major surface of the GaP substrate, the second tapered portion being covered with the inequalities substantially,
        the first tapered portion widening toward the major surface from the opposite surface,
        the second tapered portion narrowing toward the major surface from the first tapered portion, and
        a thickness of the first tapered portion being greater than a thickness of the second tapered portion.

2. The light emitting element according to claim 1, wherein a mean depth of the inequalities is greater than 1 micrometer.

3. The light emitting element according to claim 1, wherein a surrounding wall made of a same material as the mesa portion is provided so as to surround the mesa portion.

4. The light emitting element according to claim 3, wherein a mean depth of the inequalities is greater than 1 micrometer.

5. The light emitting element according to claim 3, further comprising:
    an electrode provided on the light emitting multi-layer; and
    a reflecting means interposed between the electrode and the light emitting multi-layer, the reflecting means reflecting a light emitted from the light emitting multi-layer.

6. The light emitting element according to claim 3, further comprising:
    an electrode provided on the light emitting multi-layer; and
    a current blocking layer which interposes between the electrode and the light emitting multi-layer and prevents the current injected via the electrode.

7. The light emitting element according to claim 1, further comprising a surrounding trench so as to surround the mesa portion.

8. The light emitting element according to claim 1, further comprising a GaP layer so as to cover the mesa portion.

9. The light emitting element according to claim 1, further comprising:
    an electrode provided on the light emitting multi-layer; and
    a reflecting means interposed between the electrode and the light emitting multi-layer, the reflecting means reflecting a light emitted from the light emitting multi-layer.

10. The light emitting element according to claim 1, further comprising:
    an electrode provided on the light emitting multi-layer; and
    a current blocking layer which interposes between the electrode and the light emitting multi-layer and prevents the current injected via the electrode.

11. The light emitting element according to claim 10, wherein the current blocking layer reflects the light emitted from the light emitting multi-layer.

12. The light emitting element according to claim 1, wherein the inequalities are formed on the {111} plane.

13. The light emitting element according to claim 1, wherein the inequalities are formed by etching using a liquid or a gas containing fluoric acid.

14. The light emitting element according to claim 1, wherein the major surface inclines at 5-30 degrees to the <011> direction from the {100} plane.

15. The light emitting element according to claim 14, wherein the major surface inclines at 15±1 degrees to the <011> direction from the {100} plane.

16. A light emitting device comprising:
    a mounting part;
    a light emitting element mounted on the mounting part;
    the light emitting element having:
        a GaP substrate including:
        a major surface inclined to the <011> direction from the {100} plane, the major surface being substantially flat;
        a side surface covered with inequalities substantially; and
        an opposite surface opposite to the major surface;
        a mesa portion provided on the major surface and having a light emitting multi-layer of InGaAlP based material, a part of the major surface of the GaP substrate is exposed without being covered with the mesa portion;
        a first electrode provided on the light emitting multi-layer; and
        a second electrode provided on the opposite surface of the GaP substrate,
    wherein
    a part of a light emitted from the light emitting multi-layer is extracted through the side surface of the GaP substrate,
    a width of the mesa portion is smaller than a width of the major surface of the GaP substrate in any cross-section, and
    the side surface of the GaP substrate includes:
        a first tapered portion adjacent to the opposite surface of the GaP substrate, the first tapered portion being covered with the inequalities substantially; and
        a second tapered portion adjacent to the major surface of the GaP substrate the second tapered portion being covered with the inequalities substantially,
        the first tapered portion widening toward the major surface from the opposite surface,
        the second tapered portion narrowing toward the major surface from the first tapered portion, and
        a thickness of the first tapered portion being greater than a thickness of the second tapered portion, and the GaP substrate is provided closer to the mounting part and the mesa portion is provided remoter from the mounting part.

17. The light emitting device according to claim 16, wherein a surrounding wall made of a same material as the mesa portion is provided so as to surround the mesa portion.

18. The light emitting device according to claim 16, further comprising a surrounding trench so as to surround the mesa portion.

19. The light emitting device according to claim 16, further comprising:
an electrode provided on the light emitting multi-layer; and
a reflecting means interposed between the electrode and the light emitting multi-layer, the reflecting means reflecting a light emitted from the light emitting multi-layer.

20. The light emitting device according to claim 16, further comprising:
an electrode provided on the light emitting multi-layer; and
a current blocking layer which interposes between the electrode and the light emitting multi-layer and prevents the current injected via the electrode.

* * * * *